(12) United States Patent
Kinoshita et al.

(10) Patent No.: US 11,736,104 B2
(45) Date of Patent: Aug. 22, 2023

(54) SWITCH SYSTEM

(71) Applicant: Panasonic Intellectual Property Management Co., Ltd., Osaka (JP)

(72) Inventors: Yusuke Kinoshita, Kyoto (JP); Hidetoshi Ishida, Osaka (JP); Hiroyuki Handa, Osaka (JP); Yuji Kudoh, Osaka (JP); Satoshi Nakazawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 7 days.

(21) Appl. No.: 17/633,160

(22) PCT Filed: Oct. 23, 2020

(86) PCT No.: PCT/JP2020/039822
§ 371 (c)(1),
(2) Date: Feb. 4, 2022

(87) PCT Pub. No.: WO2021/085316
PCT Pub. Date: May 6, 2021

(65) Prior Publication Data
US 2022/0337239 A1 Oct. 20, 2022

(30) Foreign Application Priority Data
Oct. 31, 2019 (JP) .............................. JP2019-198640
Aug. 27, 2020 (JP) .............................. JP2020-143911

(51) Int. Cl.
*H03K 3/00* (2006.01)
*H03K 17/687* (2006.01)
*G01R 31/26* (2020.01)

(52) U.S. Cl.
CPC ....... *H03K 17/687* (2013.01); *G01R 31/2621* (2013.01)

(58) Field of Classification Search
None
See application file for complete search history.

(56) References Cited

U.S. PATENT DOCUMENTS 6,858,895 B2 * 2/2005 Feldtkeller .......... H01L 29/7815
257/E29.264
6,870,217 B2 * 3/2005 Elbanhawy ......... H01L 29/7802
257/E29.256

(Continued)

FOREIGN PATENT DOCUMENTS

| JP | 2013-38555 A | 2/2013 |
| JP | 2019-54384 A | 4/2019 |

OTHER PUBLICATIONS

International Search Report issued in corresponding international Patent Application PCT/JP2020/027232, dated Jan. 19, 2021 with English translation.

*Primary Examiner* — Kenneth B Wells
(74) *Attorney, Agent, or Firm* — McDermott Will & Emery LLP

(57) ABSTRACT

A switch system includes a bidirectional switch, a first gate driver circuit, a second gate driver circuit, a control unit, a first decision unit, and a second decision unit. The bidirectional switch includes a first source, a second source, a first gate, and a second gate. The first decision unit determines, based on a voltage at the first gate and a first threshold voltage, a state of the first gate in a first period in which a signal to turn OFF the first gate is output from the control unit to the first gate driver circuit. The second decision unit determines, based on a voltage at the second gate and a second threshold voltage, a state of the second gate in a second period in which a signal to turn OFF the second gate (Continued)

is output from the control unit to the second gate driver circuit.

20 Claims, 24 Drawing Sheets

(56) References Cited

U.S. PATENT DOCUMENTS

| | | | | |
|---|---|---|---|---|
| 7,075,168 | B2* | 7/2006 | Sugiyama | H01L 29/7397 |
| | | | | 257/586 |
| 7,248,084 | B2* | 7/2007 | Huang | H03K 17/6871 |
| | | | | 326/82 |
| 7,868,353 | B2* | 1/2011 | Machida | H01L 27/0727 |
| | | | | 257/192 |
| 9,595,948 | B2* | 3/2017 | Akiyama | H03K 17/28 |
| 9,780,660 | B2* | 10/2017 | Hashimoto | H02M 1/32 |
| 9,853,637 | B1* | 12/2017 | Meiser | H03K 17/18 |
| 9,882,555 | B2* | 1/2018 | Meiser | H03K 17/18 |
| 10,128,750 | B2* | 11/2018 | Meiser | H01L 29/1095 |
| 10,530,360 | B2* | 1/2020 | Bina | H01L 29/7831 |
| 11,296,212 | B2* | 4/2022 | Miyoshi | H01L 29/7395 |
| 2021/0375363 | A1* | 12/2021 | Chih | G11C 16/10 |

* cited by examiner

SWITCH SYSTEM

CROSS REFERENCE TO RELATED APPLICATIONS

This patent application is the U.S. National Phase under 35 U.S.C. § 371 of International Application No. PCT/JP2020/039822, filed on Oct. 23, 2020, which claims the benefit of Japanese Patent Application No. 2019-198640, filed on Oct. 31, 2019, and Japanese Patent Application No. 2020-143911, filed on Aug. 27, 2020, the entire contents of each are hereby incorporated by reference in their entirety.

TECHNICAL FIELD

The present disclosure generally relates to a switch system, and more particularly relates to a switch system including a bidirectional switch.

BACKGROUND ART

Patent Literature 1 discloses a semiconductor device including: a first transistor and a second transistor which are inserted in series onto a power distribution path between a power supply and a load; and a diagnosis circuit for making a diagnosis on the first transistor and the second transistor.

The diagnosis circuit includes a voltage application circuit and a voltage decision circuit. The voltage application circuit applies, in a state where the first transistor and the second transistor are both controlled to OFF state, a diagnosis potential to a common concentration node between the first transistor and the second transistor. The voltage decision circuit determines, by detecting a variation in the diagnosis potential applied to the common connection node, whether or not the first transistor and/or the second transistor has caused any short-circuit failure.

The diagnosis circuit included in the semiconductor device of Patent Literature 1 makes a diagnosis by applying a diagnosis voltage to the common connection node, and therefore, cannot make such a diagnosis on a bidirectional switch with no common connection node such as a dual-gate bidirectional switch. Thus, a method that uses a node other than the common connection node is sometimes suitably used as a diagnosis method for a bidirectional switch.

CITATION LIST

Patent Literature

Patent Literature 1: JP 2019-54384 A

SUMMARY OF INVENTION

An object of the present disclosure is to provide a switch system with the ability to sense the state of a bidirectional switch.

A switch system according to an aspect of the present disclosure includes a bidirectional switch, a first gate driver circuit, a second gate driver circuit, a control unit, a first decision unit, and a second decision unit. The bidirectional switch includes: a first source; a second source, a first gate provided closer to the first source between the first source and the second source and corresponding to the first source; and a second gate provided closer to the second source between the first source and the second source and corresponding to the second source. The first gate driver circuit is connected to the first gate. The second gate driver circuit is connected to the second gate. The control unit controls the first gate driver circuit and the second gate driver circuit. The first decision unit determines, based on a voltage at the first gate and a first threshold voltage, a state of the first gate in a first period in which a signal to turn OFF the first gate is output from the control unit to the first gate driver circuit. The second decision unit determines, based on a voltage at the second gate and a second threshold voltage, a state of the second gate in a second period in which a signal to turn OFF the second gate is output from the control unit to the second gate driver circuit.

A switch system according to another aspect of the present disclosure includes a bidirectional switch, a first gate driver circuit, a second gate driver circuit, a control unit, and a sensing unit. The bidirectional switch includes; a first source; a second source; a first gate provided closer to the first source between the first source and the second source and corresponding to the first source; and a second gate provided closer to the second source between the first source and the second source and corresponding to the second source. The first gate driver circuit is connected to the first gate. The second gate driver circuit is connected to the second gate. The control unit controls the first gate driver circuit and the second gate driver circuit. The sensing unit is connected to the bidirectional switch. The switch system includes multiple sets, each of which includes the bidirectional switch, the first gate driver circuit, the second gate driver circuit, the control unit, and the sensing unit. In the switch system, a plurality of the bidirectional switches are connected in parallel with each other. Each of a plurality of the sensing units senses, when at least one of the plurality of the bidirectional switches, other than the bidirectional switch included in the same set as the sensing unit, is electrically conductive, the state of the bidirectional switch included in the same set as the sensing unit in each of a first state and a second state. The first state is a state where the control unit included in the same set as the sensing unit outputs a signal to turn OFF the first gate of the bidirectional switch included in the same set as the sensing unit and outputs a signal to turn ON the second gate thereof. The second state is a state where the control unit included in the same set as the sensing unit outputs a signal to turn OFF the second gate of the bidirectional switch included in the same set as the sensing unit and outputs a signal to turn ON the first gate thereof.

DESCRIPTION OF EMBODIMENTS

First Embodiment

A switch system 20 according to a first embodiment will now be described with reference to FIGS. 1-4.

(1) Overview

Figure 1:
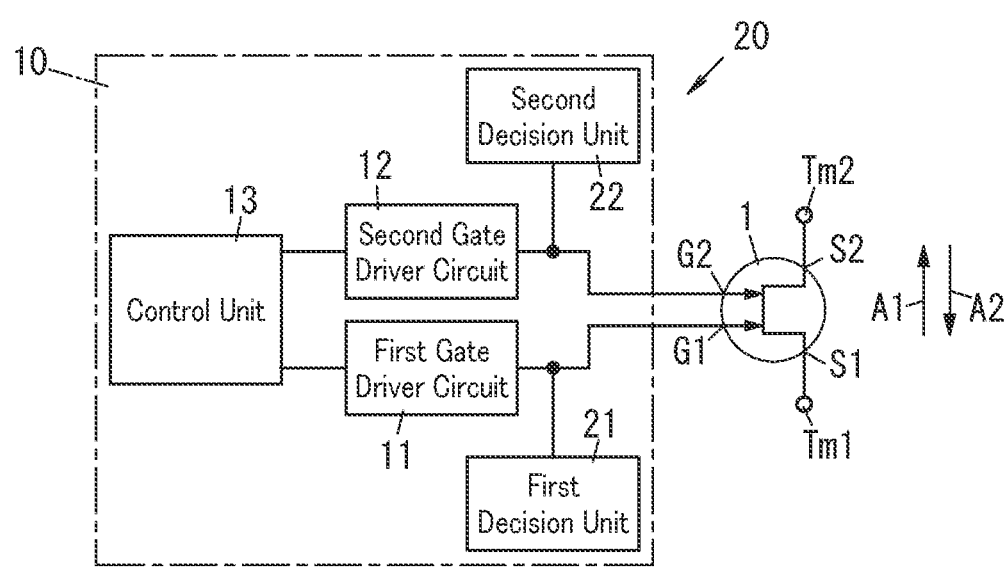
FIG. 1 is a circuit diagram of a switch system according to a first embodiment.

The switch system 20 includes a bidirectional switch 1 as shown in FIG. 1. The bidirectional switch 1 includes a first source S1, a second source S2, a first gate G1 corresponding to the first source S1, and a second gate G2 corresponding to the second source S2. The switch system 20 includes a first external connection terminal Tm1 and a second external connection terminal Tm2. The first external connection terminal Tm1 is connected to the first source S1. The second external connection terminal Tm2 is connected to the second source S2. In the switch system 20, a load circuit, including a series circuit of a load and a power supply, for example, is connected between the first external connection terminal Tm1 and the second external connection terminal Tm2. Thus, in the switch system 20, the load circuit including the series circuit of the load and the power supply is connected between the first source S1 and the second source S2 of the bidirectional switch 1. The power supply may be an AC power supply, for example.

The switch system 20 includes not only the bidirectional switch 1 but also a control system 10. The control system 10 includes a first gate driver circuit 11, a second gate driver circuit 12, and a control unit 13. The first gate driver circuit 11 is connected to the first gate G1. The second gate driver circuit 12 is connected to the second gate G2. The control unit 13 controls the first gate driver circuit 11 and the second gate driver circuit 12.

In addition, the control system 10 further includes a first decision unit 21 and a second decision unit 22. The first decision unit 21 determines the state of the first gate G1 of the bidirectional switch 1. The second decision unit 22 determines the state of the second gate G2 of the bidirectional switch 1.

(2) Constituent Elements of Switch System (2.1) Bidirectional Switch

Figure 2:
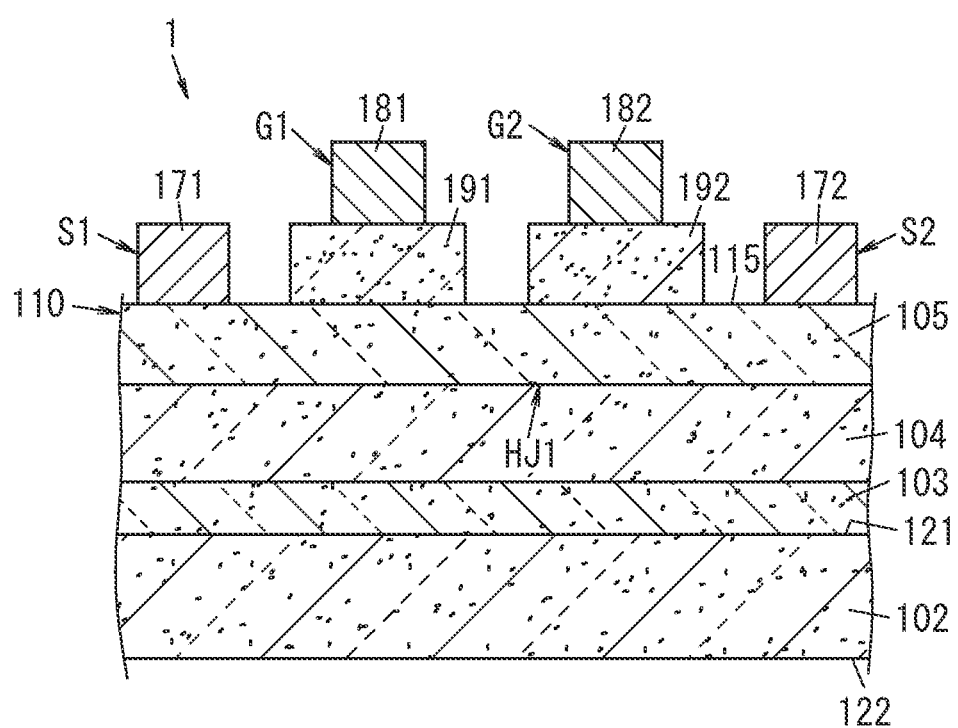
FIG. 2 is a cross-sectional view of a dual-gate bidirectional switch serving as a bidirectional switch included in the switch system.
Figure 3:
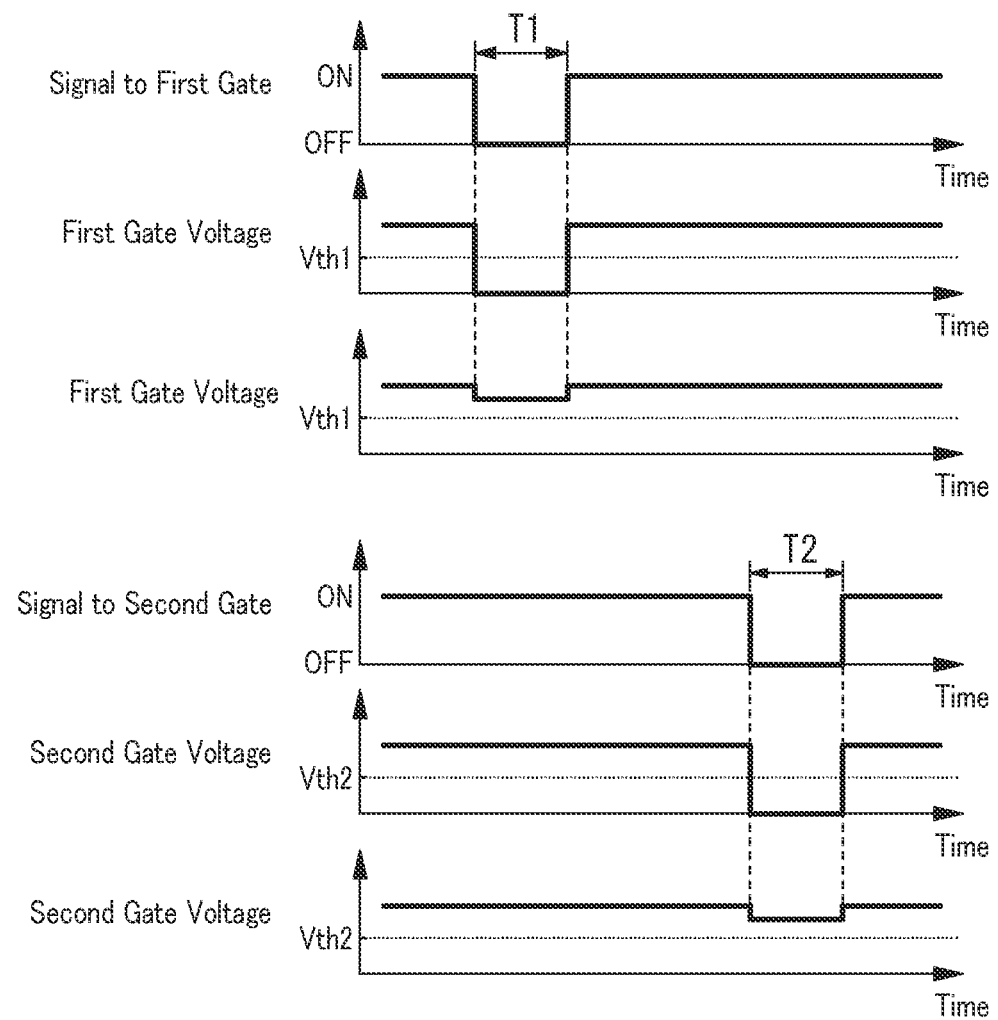
FIG. 3 is a timing chart showing how the switch system operates.
Figure 4:
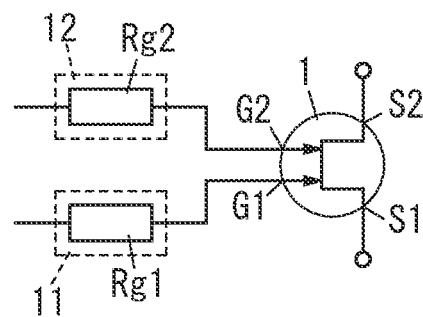
FIG. 4 is a circuit diagram of a first gate driver circuit and a second gate driver circuit included in the switch system.

The bidirectional switch 1 may be, for example, a dual-gate bidirectional switch. The dual-gate bidirectional switch is a single-chip semiconductor switching element. The bidirectional switch 1 includes, for example, a substrate 102, a first nitride semiconductor layer 104, a second nitride semiconductor layer 105, a first source electrode 171, a first gate electrode 181, a second gate electrode 182, a second source electrode 172, a first p-type layer 191, and a second p-type layer 192 as shown in FIG. 2.

In the bidirectional switch 1, the first gate G1 includes the first gate electrode 181 and the first p-type layer 191. Also, in the bidirectional switch 1, the second gate G2 includes the second gate electrode 182 and the second p-type layer 192. The bidirectional switch 1 is a dual-gate GaN-based gate injection transistor (GIT). The first nitride semiconductor layer 104 may be a GaN layer, for example. The second nitride semiconductor layer 105 may be an AlGaN layer, for example. The first p-type layer 191 may be a p-type AlGaN layer, for example. The second p-type layer 192 may be a p-type AlGaN layer, for example.

The first nitride semiconductor layer 104 is formed over the substrate 102. The second nitride semiconductor layer 105 is formed on the first nitride semiconductor layer 104. The second nitride semiconductor layer 105 has a larger bandgap than the first nitride semiconductor layer 104. The first source electrode 171 is formed on the second nitride semiconductor layer 105. The first gate electrode 181 is formed over the second nitride semiconductor layer 105 and spaced from the first source electrode 171. The second gate electrode 182 is also formed over the second nitride semiconductor layer 105 and spaced from the first gate electrode 181 so as to be located opposite from the first source electrode 171 with respect to the first gate electrode 181. The second source electrode 172 is formed on the second nitride semiconductor layer 105 and spaced from the second gate electrode 182 so as to be located opposite from the first gate electrode 181 with respect to the second gate electrode 182. The first p-type layer 191 is interposed between the first gate electrode 181 and the second nitride semiconductor layer 105. The second p-type layer 192 is interposed between the second gate electrode 182 and the second nitride semiconductor layer 105. In this bidirectional switch 1, a multi-layer stack 110 including the first nitride semiconductor layer 104, the second nitride semiconductor layer 105, the first p-type layer 191, and the second p-type layer 192 is formed on the substrate 102.

The substrate 102 may be, for example, a silicon substrate. The substrate 102 has a first principal surface 121 and a second principal surface 122 opposite from the first principal surface 121. In the bidirectional switch 1, the multi-layer stack 110 is formed over the first principal surface 121 of the substrate 102.

The first nitride semiconductor layer 104 is formed over the substrate 102 with a buffer layer 103 interposed between them. In this embodiment, the multi-layer stack 110 includes the buffer layer 103. In this multi-layer stack 110, the buffer layer 103, the first nitride semiconductor layer 104, and the second nitride semiconductor layer 105 are arranged in this order such that the buffer layer 103 is located closer to the substrate 102 than any other layer of the multi-layer stack 110 is. In addition, the multi-layer stack 110 further includes the first p-type layer 191 and the second p-type layer 192 that are formed on the second nitride semiconductor layer 105. The buffer layer 103 may be an undoped GaN layer, for example. The GaN layer serving as the first nitride semiconductor layer 104 may be an undoped GaN layer, for example. The AlGaN layer serving as the second nitride semiconductor layer 105 may be an undoped AlGaN layer, for example. Each of the buffer layer 103, the first nitride semiconductor layer 104, and the second nitride semiconductor layer 105 may include Mg, H, Si, C, O, and other impurities to be inevitably contained therein during their growth by metalorganic vapor phase epitaxy (MOVPE) process, for example.

The first p-type layer 191 and the second p-type layer 192 cover the surface 115 of the second nitride semiconductor layer 105 only partially. Thus, the surface 115 of the second nitride semiconductor layer 105 includes regions covered with the first p-type layer 191 and the second p-type layer 192 and regions covered with neither the first p-type layer 191 nor the second p-type layer 192. The first p-type layer 191 and the second p-type layer 192 are spaced apart from each other.

In the bidirectional switch 1, the second nitride semiconductor layer 105 forms, along with the first nitride semiconductor layer 104, a heterojunction HJ1. In a region in the vicinity of the heterojunction HJ1 of the first nitride semiconductor layer 104, a two-dimensional electron gas has been produced. The region including the two-dimensional electron gas (hereinafter also referred to as a "two-dimensional electron gas layer") may serve as an n-channel layer (electron conduction layer). In the bidirectional switch 1, a first diode structure (first pin diode structure) is formed by the first p-type layer 191, the second nitride semiconductor layer 105, and the n-channel layer. In addition, in the bidirectional switch 1, a second diode structure (second pin diode structure) is formed by the second p-type layer 192, the second nitride semiconductor layer 105, and the n-channel layer.

The first source electrode 171 and the second source electrode 172 are formed on the regions, covered with neither the first p-type layer 191 nor the second p-type layer 192, of the surface 115 of the second nitride semiconductor layer 105. The first source electrode 171 and the second source electrode 172 are spaced from each other. The first source electrode 171 and the second source electrode 172 are electrically connected to the heterojunction HJ1. As used herein, if two members are "electrically connected," this phrase means that the two members are in ohmic contact with each other. Each of the first source electrode 171 and the second source electrode 172 includes Ti and Al, for example.

The first gate electrode 181 is provided over the second nitride semiconductor layer 105 with the first p-type layer 191 interposed between themselves. Likewise, the second gate electrode 182 is provided over the second nitride semiconductor layer 105 with the second p-type layer 192 interposed between themselves. The distance between the first gate electrode 181 and the second gate electrode 182 is longer than the distance between the first p-type layer 191 and the second p-type layer 192. Each of the first gate electrode 181 and the second gate electrode 182 is spaced from an associated one of the first source electrode 171 or the second source electrode 172 in the direction aligned with the surface 115 of the second nitride semiconductor layer 105. The first gate electrode 181 and the second gate electrode 182 may make ohmic contact with, for example, the first p-type layer 191 and the second p-type layer 192, respectively. Each of the first gate electrode 181 and the second gate electrode 182 includes Pd and Au, for example.

In the bidirectional switch 1, the first source electrode 171, the first gate electrode 181, the second gate electrode 182, and the second source electrode 172 are arranged side by side in this order in one direction aligned with the surface 115 of the second nitride semiconductor layer 105. The first source electrode 171, the first gate electrode 181, the second gate electrode 182, and the second source electrode 172 are spaced apart from each other in the one direction.

In the following description, a state where a voltage less than a first threshold voltage Vth1 (see FIG. 3) is applied between the first gate G1 and the first source S1 with respect to the first source S1 defined as a reference will be hereinafter referred to as a state where the first gate G1 is OFF for the sake of convenience. On the other hand, a state where a voltage equal to or higher than the first threshold voltage Vth1 is applied between the first gate G1 and the first source S1 with respect to the first source S1 defined as a reference will be hereinafter referred to as a state where the first gate G1 is ON. Also, a state where a voltage less than a second threshold voltage Vth2 (see FIG. 3) is applied between the second gate G2 and the second source S2 with respect to the second source S2 defined as a reference will be hereinafter referred to as a state where the second gate G2 is OFF. On the other hand, a state where a voltage equal to or higher than the second threshold voltage Vth2 is applied between the second gate G2 and the second source S2 with respect to the second source S2 defined as a reference will be hereinafter referred to as a state where the second gate G2 is ON.

The bidirectional switch 1 is a normally-off junction field effect transistor (JFET). However, this is only an example and should not be construed as limiting. Alternatively, the bidirectional switch 1 may also be a normally-on JFET.

The bidirectional switch 1 may be switched from one of a bidirectionally ON state, a bidirectionally OFF state, a first diode state, or a second diode state to another depending on the combination of a first gate voltage applied to the first gate G1 (i.e., the voltage at the first gate G1) and a second gate voltage applied to the second gate G2 (i.e., the voltage at the second gate G2). The first gate voltage is a voltage applied between the first gate G1 and the first source S1. The second gate voltage is a voltage applied between the second gate G2 and the second source S2. The bidirectionally ON state is a state where a current is allowed to pass bidirectionally (i.e., in a first direction A1 and a second direction A2 opposite from the first direction A1). The bidirectionally OFF state is a state where a current is blocked bidirectionally. The first diode state is a state where a current is allowed to pass in the first direction A1. The second diode state is a state where a current is allowed to pass in the second direction A2. The current in the first direction A1 is a current flowing from the first source S1 toward the second source S2. The current in the second direction A2 is a current flowing from the second source S2 toward the first source S1.

In a state where the first gate G1 is ON and the second gate G2 is ON, the bidirectional switch 1 turns into the bidirectionally ON state. In a state where the first gate G1 is OFF and the second gate G2 is OFF, the bidirectional switch 1 turns into the bidirectionally OFF state. In a state where the first gate G1 is OFF and the second gate G2 is ON, the bidirectional switch 1 turns into the first diode state. In a state where the first gate G1 is ON and the second gate G2 is OFF, the bidirectional switch 1 turns into the second diode state.

(2.2) Control System

The control system 10 includes the first gate driver circuit 11, the second gate driver circuit 12, and the control unit 13 as shown in FIG. 1.

(2.2.1) First Gate Driver Circuit

The first gate driver circuit 11 is connected to the first gate G1 of the bidirectional switch 1. The first gate driver circuit 11 includes, for example, a first gate resistor Rg1 (see FIG. 4) connected to the first gate G1. The first gate driver circuit 11 is connected between the first gate G1 and the first source S1 and applies a first gate voltage between the first gate G1 and the first source S1 such that the first gate G1 has the higher potential with respect to the first source S1 with a reference potential.

(2.2.2) Second Gate Driver Circuit

The second gate driver circuit 12 is connected to the second gate G2 of the bidirectional switch 1. The second gate driver circuit 12 includes, for example, a second gate resistor Rg2 (see FIG. 4) connected to the second gate G2. The second gate driver circuit 12 is connected between the second gate G2 and the second source S2 and applies a second gate voltage between the second gate G2 and the second source S2 such that the second gate G2 has the higher potential with respect to the second source S2 with a reference potential.

(2.2.3) Control Unit

The control unit 13 controls the first gate driver circuit 11 and the second gate driver circuit 12.

The control unit 13 has, as its operation modes, a normal mode, a first decision mode, and a second decision mode. When operating in the normal mode, the control unit 13 outputs a signal to turn ON the first gate G1 to the first gate driver circuit 11 and also outputs a signal to turn ON the second gate G2 to the second gate driver circuit 12. The signal to turn ON the first gate G1 is a voltage signal with a voltage level that makes a first gate voltage applied from the first gate driver circuit 11 to the first gate G1 greater than the first threshold voltage Vth1. The signal to turn ON the second gate G2 is a voltage signal with a voltage level that makes a second gate voltage applied from the second gate driver circuit 12 to the second gate G2 greater than the second threshold voltage Vth2.

When operating in the first decision mode, the control unit 13 outputs a signal to turn OFF the first gate G1 to the first gate driver circuit 11 only for a first period T1. The signal to turn OFF the first gate G1 is a voltage signal with a voltage level that makes the first gate voltage applied from the first gate driver circuit 11 to the first gate G1 less than the first threshold voltage Vth1 and may be a voltage signal of 0 V, for example. The state of the first gate G1 includes, for example, a non-abnormal state where the first gate G1 can be turned OFF normally and an abnormal state where the first gate G1 cannot be turned OFF normally. In the switch system 20, if the first gate G1 is in the abnormal state, either the bidirectional switch 1 or the first gate driver circuit 11 is out of order.

When operating in the second decision mode, the control unit 13 outputs a signal to turn OFF the second gate G2 to the second gate driver circuit 12 only for a second period T2. The signal to turn OFF the second gate G2 is a voltage signal with a voltage level that makes the second gate voltage applied from the second gate driver circuit 12 to the second gate G2 less than the second threshold voltage Vth2 and may be a voltage signal of 0 V, for example. The state of the second gate G2 includes, for example, a non-abnormal state where the second gate G2 can be turned OFF normally and an abnormal state where the second gate G2 cannot be turned OFF normally. In the switch system 20, if the second gate G2 is in the abnormal state, either the bidirectional switch 1 or the second gate driver circuit 12 is out of order.

The control unit 13 controls the first gate driver circuit 11 and the second gate driver circuit 12 such that the first period T1 and the second period T2 do not overlap with each other by defining the first period T1 and the second period T2 at mutually different timings.

The control unit 13 includes a computer system. The computer system includes a single computer or a plurality of computers. The computer system includes, as principal hardware components, a processor and a memory. At least some functions of the control unit 13 according to the present disclosure may be performed by making the processor execute a program stored in the memory of the computer system. The program may be stored in advance in the memory of the computer system. Alternatively, the program may also be downloaded through a telecommunications line or be distributed after having been recorded in some non-transitory storage medium such as a memory card, an optical disc, or a hard disk drive (magnetic disk), any of which is readable for the computer system. The processor of the computer system may be made up of a single or a plurality of electronic circuits including a semiconductor integrated circuit (IC) or a large-scale integrated circuit (LSI). Those electronic circuits may be either integrated together on a single chip or distributed on multiple chips, whichever is appropriate. Those multiple chips may be integrated together in a single device or distributed in multiple devices without limitation.

The control unit 13 includes a first power supply connected to the first gate driver circuit 11 and a second power supply connected to the second gate driver circuit 12. However, this is only an example and should not be construed as limiting.

Figure 5:
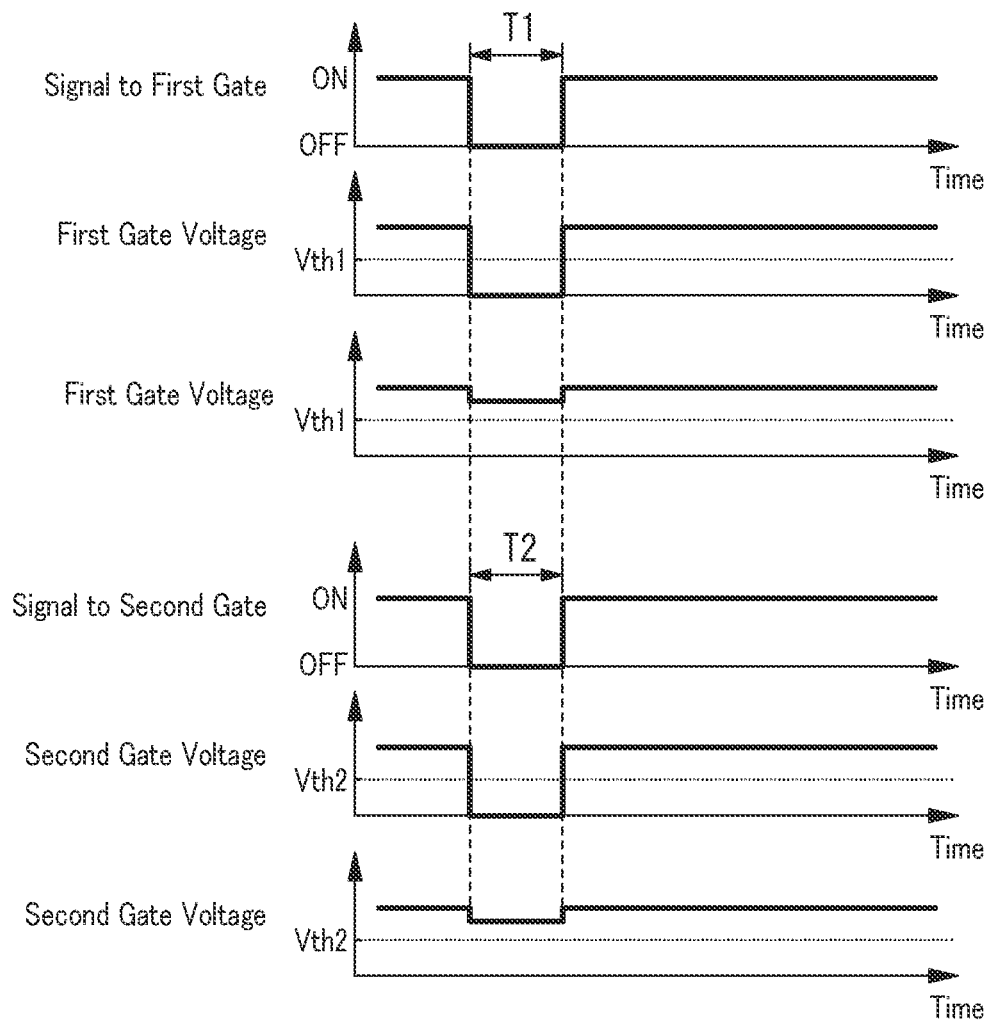
FIG. 5 is a timing chart showing how the switch system operates.

Alternatively, the control unit 13 may also control the first gate driver circuit 11 and the second gate driver circuit 12 by defining the first period T1 and the second period T2 in synch with each other (i.e., at the same timing) such that the first period T1 and the second period T2 completely overlap with each other as shown in FIG. 5. Still alternatively, the control unit 13 may also control the first gate driver circuit 11 and the second gate driver circuit 12 such that the first period T1 and the second period T2 at least partially overlap with each other.

In this embodiment, the first period T1 and the second period T2 have the same length. However, this is only an example and should not be construed as limiting. Alternatively, the first period T1 and the second period T2 may have mutually different lengths.

(2.2.4) First Decision Unit

The first decision unit 21 determines, based on a first gate voltage (see FIG. 3) that is a voltage at the first gate G1 and the first threshold voltage Vth1 (see FIG. 3), the state of the first gate G1 in the first period T1 (see FIG. 3) in which a signal to turn OFF the first gate G1 is output from the control unit 13 to the first gate driver circuit 11. The first decision unit 21 decides, when finding the first gate voltage less than the first threshold voltage Vth1 in the first period T1 (see the uppermost waveform in FIG. 3) as indicated by the second uppermost waveform in FIG. 3, for example, that the state of the first gate G1 should be non-abnormal. On the other hand, the first decision unit 21 decides, when finding the first gate voltage equal to or greater than the first threshold voltage Vth1 in the first period T1 as indicated by the third uppermost waveform in FIG. 3, for example, that the state of the first gate G1 should be abnormal.

The first decision unit 21 includes a first comparator for comparing the first gate voltage with a first reference voltage corresponding to the first threshold voltage Vth1, for example. In that case, the first decision unit 21 is configured such that the first reference voltage is input to an inverting terminal of the first comparator and the first gate voltage is input to a non-inverting terminal of the first comparator. In the first decision unit 21, if the first gate voltage is equal to or greater than the first reference voltage, then an output signal of the first comparator comes to have H level. On the other hand, if the first gate voltage is less than the first reference voltage, then the output signal of the first comparator comes to have L level. In the first decision unit 21, if the output signal of the first comparator has H level in the first period T1, this means that the first decision unit 21 has determined the state of the first gate G1 to be abnormal. If the output signal of the first comparator has L level in the first period T1, this means that the first decision unit 21 has determined the state of the first gate G1 to be non-abnormal. Optionally, the switch system 20 may also be configured such that the decision made by the first decision unit 21 is input to the control unit 13.

(2.2.5) Second Decision Unit

The second decision unit 22 determines, based on a second gate voltage (see FIG. 3) that is a voltage at the second gate G2 and the second threshold voltage Vth2 (see FIG. 3), the state of the second gate G2 in the second period T2 (see FIG. 3) in which a signal to turn OFF the second gate G2 is output from the control unit 13 to the second gate driver circuit 12. The second decision unit 22 decides, when finding the second gate voltage less than the second threshold voltage Vth2 in the second period T2 (see the fourth uppermost waveform in FIG. 3) as indicated by the fifth uppermost waveform in FIG. 3, for example, that the state of the second gate G2 should be non-abnormal. On the other hand, the second decision unit 22 decides, when finding the second gate voltage equal to or greater than the second threshold voltage Vth2 in the second period T2 as indicated by the sixth uppermost waveform in FIG. 3, for example, that the state of the second gate G2 should be abnormal.

The second decision unit 22 includes a second comparator for comparing the second gate voltage with a second reference voltage corresponding to the second threshold voltage Vth2, for example. In that case, the second decision unit 22 is configured such that the second reference voltage is input to an inverting terminal of the second comparator and the second gate voltage is input to a non-inverting terminal of the second comparator. In the second decision unit 22, if the second gate voltage is equal to or greater than the second reference voltage, then an output signal of the second comparator comes to have H level. On the other hand, if the second gate voltage is less than the second reference voltage, then the output signal of the second comparator comes to have L level. In the second decision unit 22, if the output signal of the second comparator has H level in the second period T2, this means that the second decision unit 22 has determined the state of the second gate G2 to be abnormal. If the output signal of the second comparator has L level in the second period T2, this means that the second decision unit 22 has determined the state of the second gate G2 to be non-abnormal. Optionally, the switch system 20 may also be configured such that the decision made by the second decision unit 22 is input to the control unit 13.

(3) Advantages

A switch system 20 according to the first embodiment includes a bidirectional switch 1, a first gate driver circuit 11, a second gate driver circuit 12, a control unit 13, a first decision unit 21, and a second decision unit 22. The bidirectional switch 1 includes a first source S1, a second source S2, a first gate G1 provided closer to the first source S1 between the first source S1 and the second source S2 and corresponding to the first source S1, and a second gate G2 provided closer to the second source S2 between the first source S1 and the second source S2 and corresponding to the second source S2. The first gate driver circuit 11 is connected to the first gate G1. The second gate driver circuit 12 is connected to the second gate G2. The control unit 13 controls the first gate driver circuit 11 and the second gate driver circuit 12. The first decision unit 21 determines, based on a voltage at the first gate G1 and a first threshold voltage Vth1, a state of the first gate G1 in a first period T1 in which a signal to turn OFF the first gate G1 is output from the control unit 13 to the first gate driver circuit 11. The second decision unit 22 determines, based on a voltage at the second gate G2 and a second threshold voltage Vth2, a state of the second gate G2 in a second period T2 in which a signal to turn OFF the second gate G2 is output from the control unit 13 to the second gate driver circuit 12.

The switch system 20 according to the first embodiment may sense the state of the bidirectional switch 1 (i.e., whether or not the bidirectional switch 1 has caused a failure). For example, in the switch system 20 according to the first embodiment, if the first decision unit 21 has determined the state of the first gate G1 to be "abnormal" and/or if the second decision unit 22 has determined the state of the second gate G2 to be "abnormal," then a decision may be made that the bidirectional switch 1 should be out of order (i.e., the state of the bidirectional switch 1 may be sensed). In addition, in the switch system 20 according to the first embodiment, if the first decision unit 21 has determined the state of the first gate G1 to be "non-abnormal" and if the second decision unit 22 has determined the state of the second gate G2 to be "non-abnormal," then a decision may be made that the bidirectional switch 1 should be in working order (i.e., the state of the bidirectional switch 1 may be sensed).

Second Embodiment

A switch system 20a according to a second embodiment will be described with reference to FIGS. 6 and 7. In the following description, any constituent element of the switch system 20a according to this second embodiment, having the same function as a counterpart of the switch system 20 according to the first embodiment described above, will be designated by the same reference numeral as that counterpart's, and description thereof will be omitted herein as appropriate.

The switch system 20a according to the second embodiment includes a control system 10a instead of the control system 10 of the switch system 20 according to the first embodiment.

As shown in FIG. 2, the bidirectional switch 1 is a normally-off JFET of which the first gate G1 includes a first p-type layer 191 and a first gate electrode 181 and the second gate G2 includes a second p-type layer 192 and a second gate electrode 182.

The control system 10a includes a first gate driver circuit 11a and a second gate driver circuit 12a, which respectively have different circuit configurations from the first gate driver circuit 11 and the second gate driver circuit 12 of the control system 10. The control system 10a includes a control unit 13a instead of the control unit 13 of the control system 10.

Figure 6:
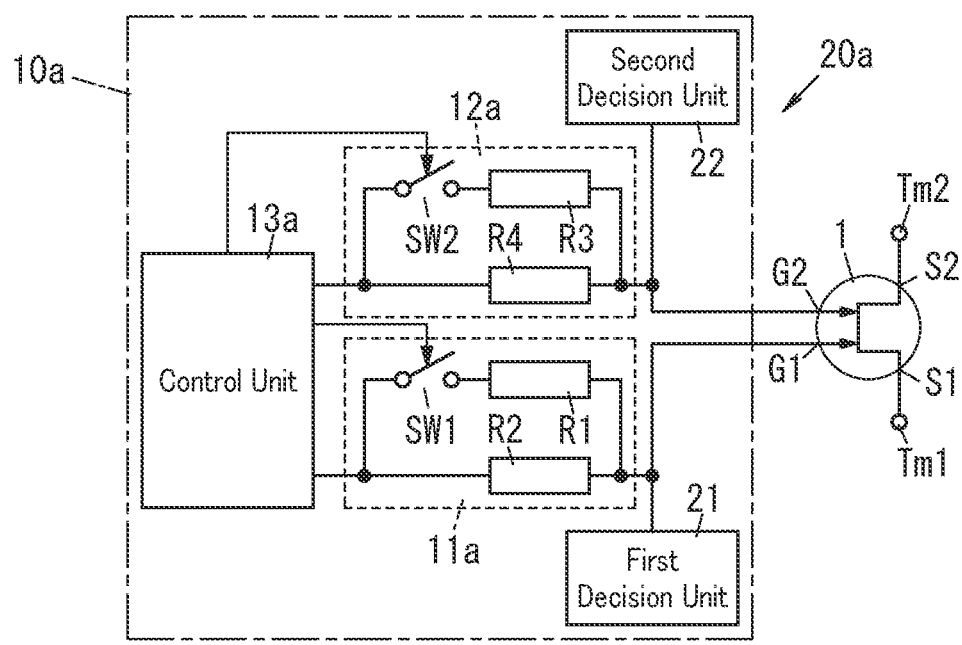
FIG. 6 is a circuit diagram of a switch system according to a second embodiment.

As shown in FIG. 6, the first gate driver circuit 11a includes a first gate resistor R1, a first switch SW1, and a second gate resistor R2. The first gate resistor R1 is connected to the first gate G1. The first switch SW1 is connected to the first gate resistor R1 in series and is controlled by the control unit 13a. The second gate resistor R2 has a larger resistance value than the first gate resistor R1. The second gate resistor R2 is connected in parallel to a series circuit of the first gate resistor R1 and the first switch SW1. The resistance value of the second gate resistor R2 is determined such that only a gate current that makes the first gate voltage of the first gate G1 of the normally off FET serving as the bidirectional switch 1 less than the first threshold voltage Vth1 may be supplied.

The second gate driver circuit 12a includes a third gate resistor R3, a second switch SW2, and a fourth gate resistor R4. The third gate resistor R3 is connected to the second gate G2. The second switch SW2 is connected to the third gate resistor R3 in series and is controlled by the control unit 13a. The fourth gate resistor R4 has a larger resistance value than the third gate resistor R3. The fourth gate resistor R4 is connected in parallel to a series circuit of the third gate resistor R3 and the second switch SW2. The resistance value of the fourth gate resistor R4 is determined such that only a gate current that makes the second gate voltage of the second gate G2 of the normally off JFET serving as the bidirectional switch 1 less than the second threshold voltage Vth2 may be supplied.

In the switch system 20a according to the second embodiment, the control unit 13a controls the first switch SW1 of the first gate driver circuit 11a and the second switch SW2 of the second gate driver circuit 12a. Each of the first switch SW1 and the second switch SW2 may be for example, a normally-off semiconductor switch.

The control unit 13a has, as its operation modes, the normal mode, the first decision mode, and the second mode, as well as the control unit 13 of the switch system 20 according to the first embodiment, and further has a third decision mode and a fourth decision mode.

When operating in the normal mode, the control unit 13a outputs a signal to turn ON the first gate G1 and a signal to turn ON the first switch SW1 to the first gate driver circuit 1a and also outputs a signal to turn ON the second gate G2 and a signal to turn ON the second switch SW2 to the second gate driver circuit 12a. The signal to turn ON the first gate G1 is a voltage signal with a voltage level that makes a first gate voltage applied from the first gate driver circuit 11a to the first gate G1 greater than the first threshold voltage Vth1. The signal to turn ON the second gate G2 is a voltage signal with a voltage level that makes a second gate voltage applied from the second gate driver circuit 12a to the second gate G2 greater than the second threshold voltage Vth2.

When operating in the first decision mode, the control unit 13a outputs a signal to turn OFF the first gate G1 to the first gate driver circuit 11a only for the first period T1 and also outputs a signal to turn ON the first switch SW1. The signal to turn OFF the first gate G1 is a voltage signal with a voltage level that makes the first gate voltage applied from the first gate driver circuit 11a to the first gate G1 less than the first threshold voltage Vth1 and may be a voltage signal of 0 V, for example. The state of the first gate G1 includes, for example, a non-abnormal state where the first gate G1 can be turned OFF normally and an abnormal state where the first gate G1 cannot be turned OFF normally. In the switch system 20a, if the first gate G1 is in the abnormal state, either the bidirectional switch 1 or the first gate driver circuit 11a is out of order.

When operating in the second decision mode, the control unit 13a outputs a signal to turn OFF the second gate G2 to the second gate driver circuit 12a only for the second period T2 and also outputs a signal to turn ON the second switch SW2. The signal to turn OFF the second gate G2 is a voltage signal with a voltage level that makes the second gate voltage applied from the second gate driver circuit 12a to the second gate G2 less than the second threshold voltage Vth2 and may be a voltage signal of 0 V, for example. The state of the second gate G2 includes, for example, a non-abnormal state where the second gate G2 can be turned OFF normally and an abnormal state where the second gate G2 cannot be turned OFF normally. In the switch system 20a, if the second gate G2 is in the abnormal state, either the bidirectional switch 1 or the second gate driver circuit 12a is out of order.

Figure 7:
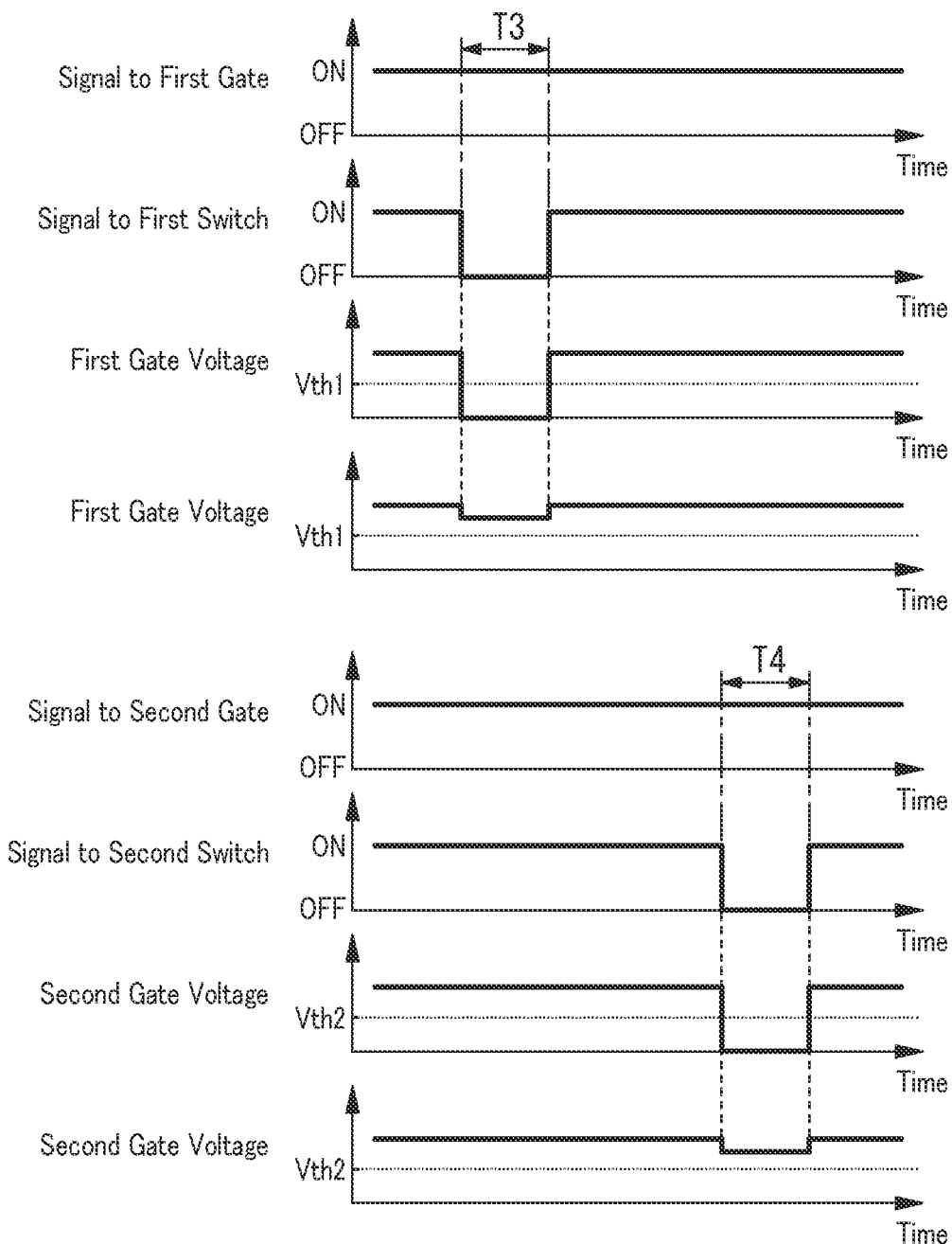
FIG. 7 is a timing chart showing how the switch system operates.

When operating in the third decision mode, the control unit 13a outputs a signal to turn ON the first gate G1 and a signal to turn OFF the first switch SW1 in a third period T3 (see FIG. 7).

When operating in the fourth decision mode, the control unit 13a outputs a signal to turn ON the second gate G2 and a signal to turn OFF the second switch SW2 in a fourth period T4 (see FIG. 7).

The first decision unit 21 determines, based on a first gate voltage (see FIG. 3) that is a voltage at the first gate G1 and the first threshold voltage Vth1 (see FIG. 3), the state of the first gate G1 in the first period T1 (see FIG. 3) in which a signal to turn ON the first switch SW1 and a signal to turn OFF the first gate G1 are output from the control unit 13a to the first gate driver circuit 11a when the control unit 13a is operating in the first decision mode. The first decision unit 21 decides, when finding the first gate voltage less than the first threshold voltage Vth1 in the first period T1 (see the uppermost waveform in FIG. 3) as indicated by the second uppermost waveform in FIG. 3, for example, that the state of the first gate G1 should be non-abnormal. On the other hand, the first decision unit 21 decides, when finding the first gate voltage equal to or greater than the first threshold voltage Vth1 in the first period T1 as indicated by the third uppermost waveform in FIG. 3, for example, that the state of the first gate G1 should be abnormal.

The second decision unit 22 determines, based on a second gate voltage (see FIG. 3) that is a voltage at the second gate G2 and the second threshold voltage Vth2 (see FIG. 3), the state of the second gate G2 in the second period T2 (see FIG. 3) in which a signal to turn ON the second switch SW2 and a signal to turn OFF the second gate G2 are output from the control unit 13a to the second gate driver circuit 12a when the control unit 13a is operating in the second decision mode. The second decision unit 22 decides, when finding the second gate voltage less than the second threshold voltage Vth1 in the second period T2 (see the fourth uppermost waveform in FIG. 3) as indicated by the fifth uppermost waveform in FIG. 3, for example, that the state of the second gate G2 should be non-abnormal. On the other hand, the second decision unit 22 decides, when finding the second gate voltage equal to or greater than the second threshold voltage Vth2 in the second period T2 as indicated by the sixth uppermost waveform in FIG. 3, for example, that the state of the second gate G2 should be abnormal.

The first decision unit 21 decides, when finding the voltage at the first gate G1 less than the first threshold voltage Vth1 as indicated by the third uppermost waveform in FIG. 7 while a signal to turn ON the first gate G1 and a signal to turn OFF the first switch SW1 are output from the control unit 13a operating in the third decision mode (i.e., in the third period T3), that the state of the first gate G1 should be non-abnormal. On the other hand, when finding the voltage at the first gate G1 greater than the first threshold voltage Vth1 as indicated by the fourth uppermost waveform in FIG. 7, the first decision unit 21 decides that the state of the first gate G1 should be abnormal.

The second decision unit 22 determines, when finding the voltage at the second gate G2 less than the second threshold voltage Vth2 as indicated by the seventh uppermost waveform in FIG. 7 while a signal to turn ON the second gate G2 and a signal to turn OFF the second switch SW2 are output from the control unit 13a operating in the fourth decision mode (i.e., in the fourth period T4), that the state of the second gate G2 should be non-abnormal. On the other hand, when finding the voltage at the second gate G2 greater than the second threshold voltage Vth2 as indicated by the eighth uppermost waveform in FIG. 7, the second decision unit 22 decides that the state of the second gate G2 should be abnormal.

The switch system 20a according to the second embodiment may determine the state of the bidirectional switch 1 (whether or not the bidirectional switch 1 is out of order) while the control unit 13a is operating in the first decision mode and while the control unit 13a is operating in the second decision mode.

In addition, if the first decision unit 21 has decided that the state of the first gate G1 should be abnormal while the control unit 13a is operating in the third decision mode, the switch system 20a according to the second embodiment may decide that the first gate G1 should be in an open-circuit state (i.e., the bidirectional switch 1 should be short-circuited).

Furthermore, if the second decision unit 22 has decided that the state of the second gate G2 should be abnormal while the control unit 13a is operating in the fourth decision mode, the switch system 20a according to the second embodiment may decide that the second gate G2 should be in an open-circuit state (i.e., the bidirectional switch 1 should be short-circuited).

Variation of Second Embodiment

A switch system 20a according to a variation of the second embodiment has the same circuit configuration as the switch system 20a according to the second embodiment shown in FIG. 6, and therefore, illustration and description thereof will be omitted herein.

In the switch system 20a according to this variation of the second embodiment, the control unit 13a makes the first decision unit 21 perform the decision operation in the normal mode and also makes the second decision unit 22 perform the decision operation in the normal mode, which is a major difference from the switch system 20a according to the second embodiment.

Figure 8:
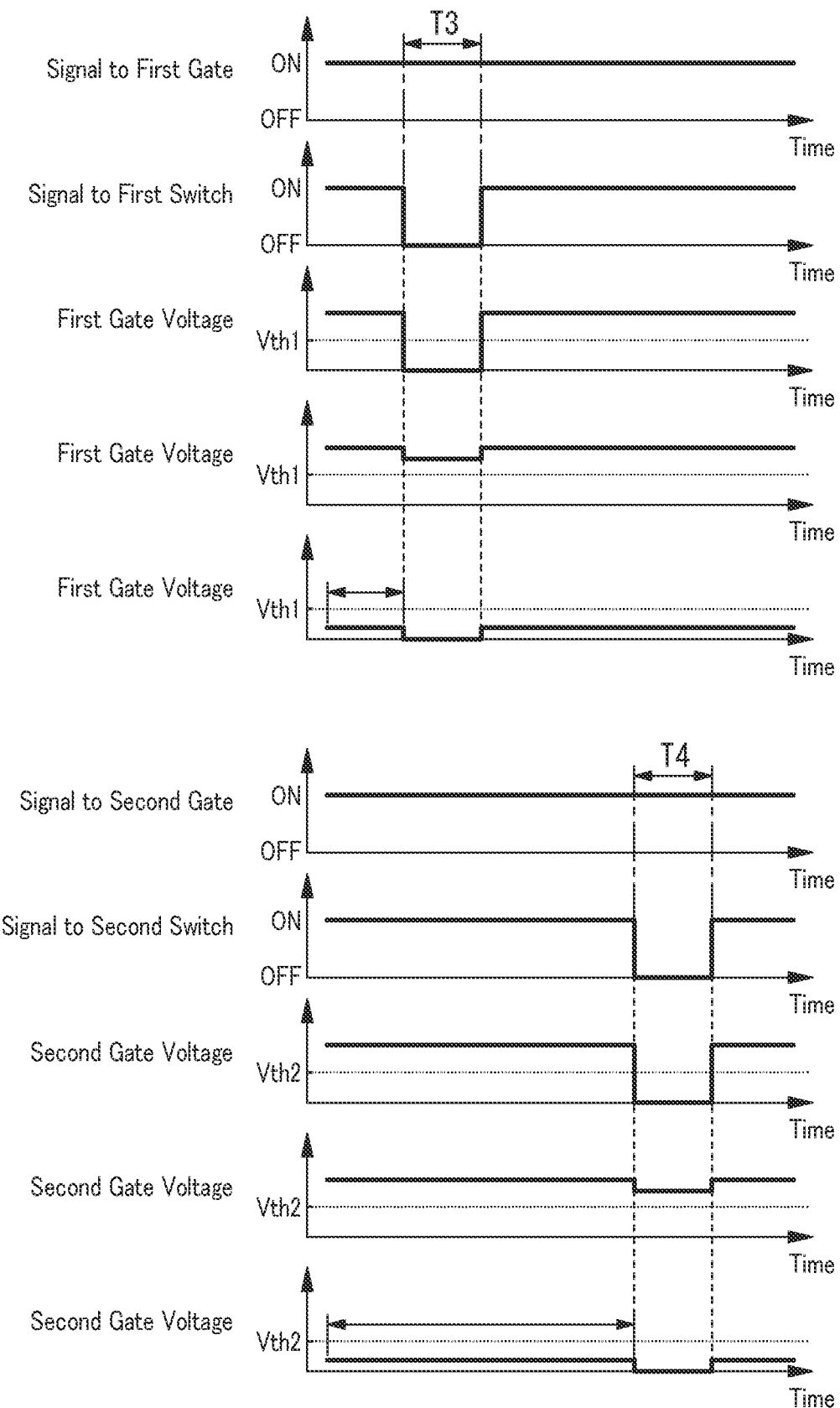
FIG. 8 is a timing chart showing how a switch system according to a variation of the second embodiment operates.

The first decision unit 21 decides, when finding the voltage at the first gate G1 less than the first threshold voltage Vth1 (as indicated by the fifth uppermost waveform in FIG. 8) while a signal to turn ON the first gate G1 and a signal to turn ON the first switch SW1 are output from the control unit 13a (i.e., while the control unit 13a is operating in the normal mode) as indicated by the first and second uppermost waveforms in FIG. 8, that the state of the first gate G1 should be abnormal. In that case, the first gate G1 has caused a short-circuit failure (i.e., a failure that a short-circuit of the first pin diode has caused a decrease in resistance value) and the bidirectional switch 1 has caused an open-circuit failure.

The second decision unit 22 decides, when finding the voltage at the second gate G2 less than the second threshold voltage Vth2 (as indicated by the tenth uppermost waveform in FIG. 8) while a signal to turn ON the second gate G2 and a signal to turn ON the second switch SW2 are output from the control unit 13a (i.e., while the control unit 13a is operating in the normal mode) as indicated by the sixth and seventh uppermost waveforms in FIG. 8, that the state of the second gate G2 should be abnormal. In that case, the second gate G2 has caused a short-circuit failure (i.e., a failure that a short-circuit of the second pin diode has caused a decrease in resistance value) and the bidirectional switch 1 has caused an open-circuit failure.

The first decision unit 21 decides, when finding the voltage at the first gate G1 greater than the first threshold voltage Vth1 (as indicated by the fourth uppermost waveform in FIG. 8) while a signal to turn ON the first gate G1 and a signal to turn OFF the first switch SW1 are output from the control unit 13a (i.e., in the third period T3) as indicated by the first and second uppermost waveforms in FIG. 8, that the state of the first gate G1 should be abnormal. In that case, the first gate G1 has caused an open-circuit failure and the bidirectional switch 1 has caused a short-circuit failure.

The second decision unit 22 decides, when finding the voltage at the second gate G2 greater than the second threshold voltage Vth2 (as indicated by the ninth uppermost waveform in FIG. 8) while a signal to turn ON the second gate G2 and a signal to turn OFF the second switch SW2 are output from the control unit 13a (i.e., in the fourth period T4) as indicated by the sixth and seventh uppermost waveforms in FIG. 8, that the state of the second gate G2 should be abnormal. In that case, the second gate G2 has caused an open-circuit failure and the bidirectional switch 1 has caused a short-circuit failure.

In the switch system 20a according to this variation of the second embodiment, the first decision unit 21 may decide that the first gate G1 should have caused a short-circuit failure. This allows the control unit 13a, for example, to learn that when the first gate G1 has caused a short-circuit failure, the first gate G1 cannot turn from OFF to ON.

In the switch system 20a according to this variation of the second embodiment, the second decision circuit 22 may decide that the second gate G2 should have caused a short-circuit failure. This allows the control unit 13a, for example, to learn that when the second gate G2 has caused a short-circuit failure, the second gate G2 cannot turn from OFF to ON.

Third Embodiment

Figure 9:
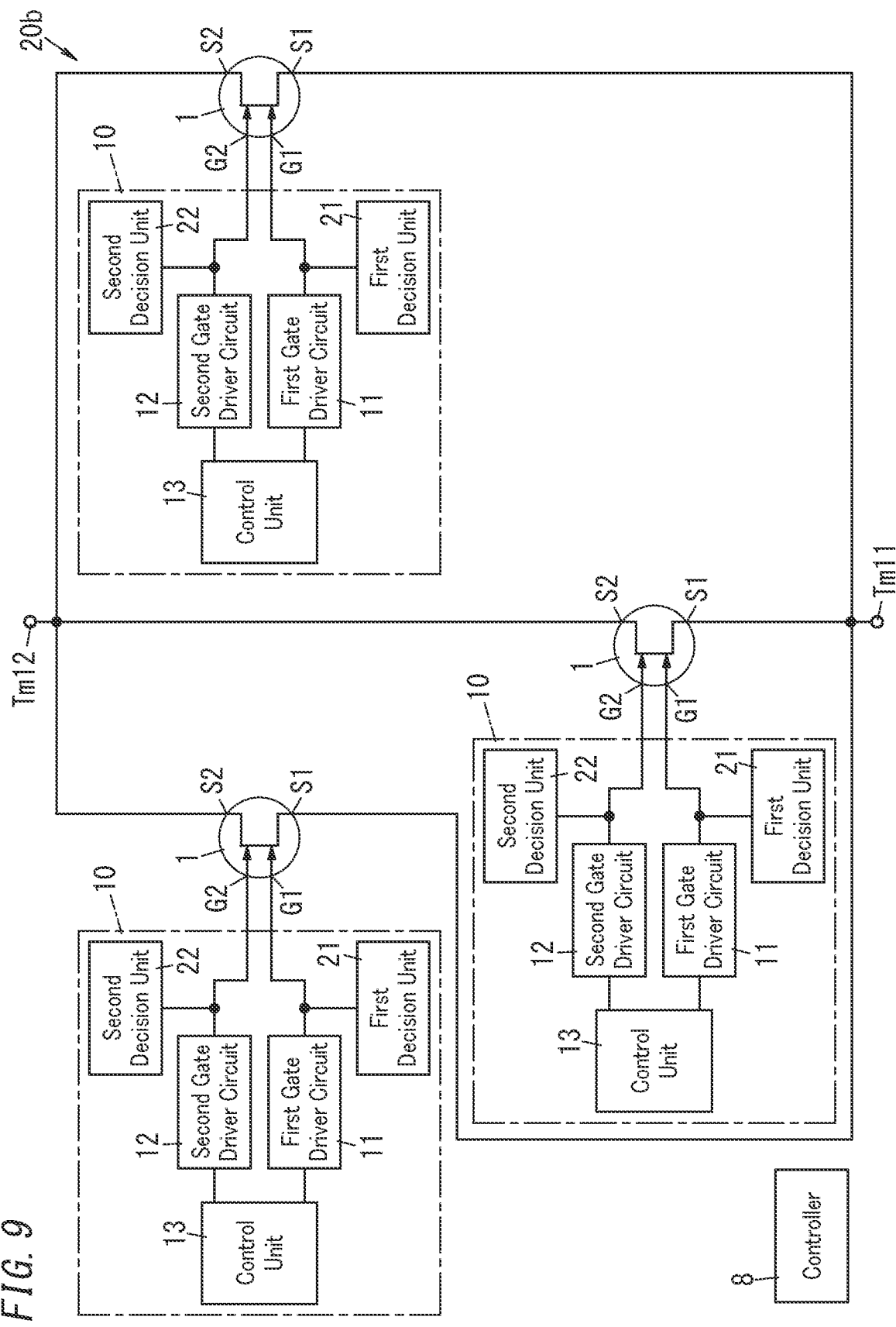
FIG. 9 is a circuit diagram of a switch system according to a third embodiment.

A switch system 20b according to a third embodiment will be described with reference to FIG. 9. In the following description, any constituent element of the switch system 20b according to this third embodiment, having the same function as a counterpart of the switch system 20 according to the first embodiment described above, will be designated by the same reference numeral as that counterpart's, and description thereof will be omitted herein as appropriate.

The switch system 20b includes a plurality of (e.g., three in the example illustrated in FIG. 9) bidirectional switches 1, a plurality of (e.g., three in the example illustrated in FIG. 9) first decision units 21, and a plurality of (e.g., three in the example illustrated in FIG. 9) second decision units 22. In addition, the switch system 20b also includes a plurality of (e.g., three in the example illustrated in FIG. 9) control units 13. The switch system 20b includes a plurality of control systems 10.

In the switch system 20b, the plurality of bidirectional switches 1 are connected in parallel with each other. The switch system 20b further includes a first external connection terminal Tm11 and a second external connection terminal Tm12. In the switch system 20b, the respective first sources S1 of the plurality of bidirectional switches 1 are connected to the first external connection terminal Tm11, and the respective second sources S2 of the plurality of bidirectional switches 1 are connected to the second external connection terminal Tm12.

The plurality of first decision units 21 and the plurality of second decision units 22 correspond one to one to the plurality of bidirectional switches 1.

In the switch system 20b, the plurality of control systems 10 correspond one to one to the plurality of bidirectional switches 1.

The switch system 20b further includes a controller 8 for controlling the plurality of control units 13.

The switch system 20b normally controls the plurality of bidirectional switches 1 toward the same state (i.e., either ON state or OFF state) but performs the following operation when making a failure diagnosis on the plurality of bidirectional switches 1.

The switch system 20b regards at least one (e.g., one or two) of the plurality of (e.g., three) bidirectional switches 1 as a non-target bidirectional switch and makes the first decision unit 21 and the second decision unit 22 respectively determine states of the first gate G1 and the second gate G2 of a target bidirectional switch 1 out of the plurality of bidirectional switches 1 while a current is allowed to flow between the first and second sources S1, S2 of the non-target bidirectional switch 1. Thus, the switch system 20b allows the state of the first gate G1 of the target bidirectional switch 1 to be determined by the first decision unit 21 corresponding to the target bidirectional switch 1 without interrupting the current flowing between the first external connection terminal Tm11 and the second external connection terminal Tm12. In addition, the switch system 20b also allows the state of the second gate G2 of the target bidirectional switch 1 to be determined by the second decision unit 22 corresponding to the target bidirectional switch 1 without interrupting the current flowing between the first external connection terminal Tm11 and the second external connection terminal Tm12. Thus, when used as a current interrupter, for example, the switch system 20b may make a failure diagnosis without interrupting the current for the purpose of the failure diagnosis.

If the number of the plurality of bidirectional switches 1 is three or more, then the number of the target bidirectional switch(es) 1 is preferably one from the viewpoint of reducing concentration of a current on the non-target bidirectional switches 1. The switch system 20b regards only one of the bidirectional switches 1 as the target bidirectional switch 1 and all the other bidirectional switches 1 as non-target bidirectional switches 1, thus contributing to reducing the chances of causing thermal destruction on the non-target bidirectional switches 1 and thereby extending the life of the plurality of bidirectional switches 1.

In the switch system 20b, the controller 8 classifies the plurality of bidirectional switches 1 into the target bidirectional switch 1 and non-target bidirectional switches 1 and controls the plurality of control units 13 corresponding one to one to the plurality of bidirectional switches 1. However, this is only an example and should not be construed as limiting. Alternatively, each of the plurality of control systems 10 may determine, following a predetermined time schedule, whether the bidirectional switch 1 corresponding to the control system 10 should be controlled as a target bidirectional switch 1 or a non-target bidirectional switch 1.

Fourth Embodiment

Figure 10:
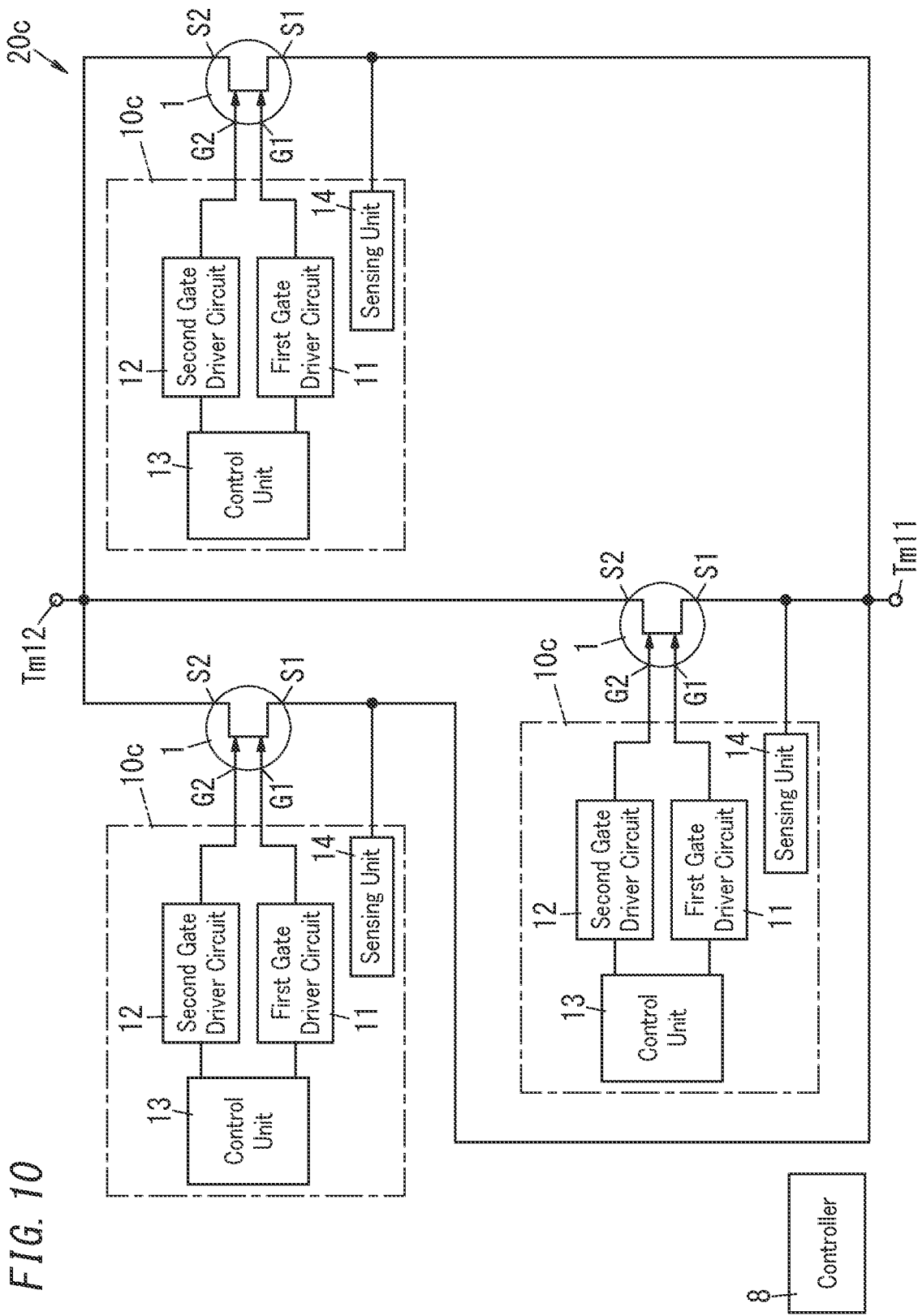
FIG. 10 is a circuit diagram of a switch system according to a fourth embodiment.

A switch system 20c according to a fourth embodiment will be described with reference to FIG. 10. In the following description, any constituent element of the switch system 20c according to this fourth embodiment, having the same function as a counterpart of the switch system 20b according to the third embodiment described above, will be designated by the same reference numeral as that counterpart's, and description thereof will be omitted herein as appropriate.

Figure 12:
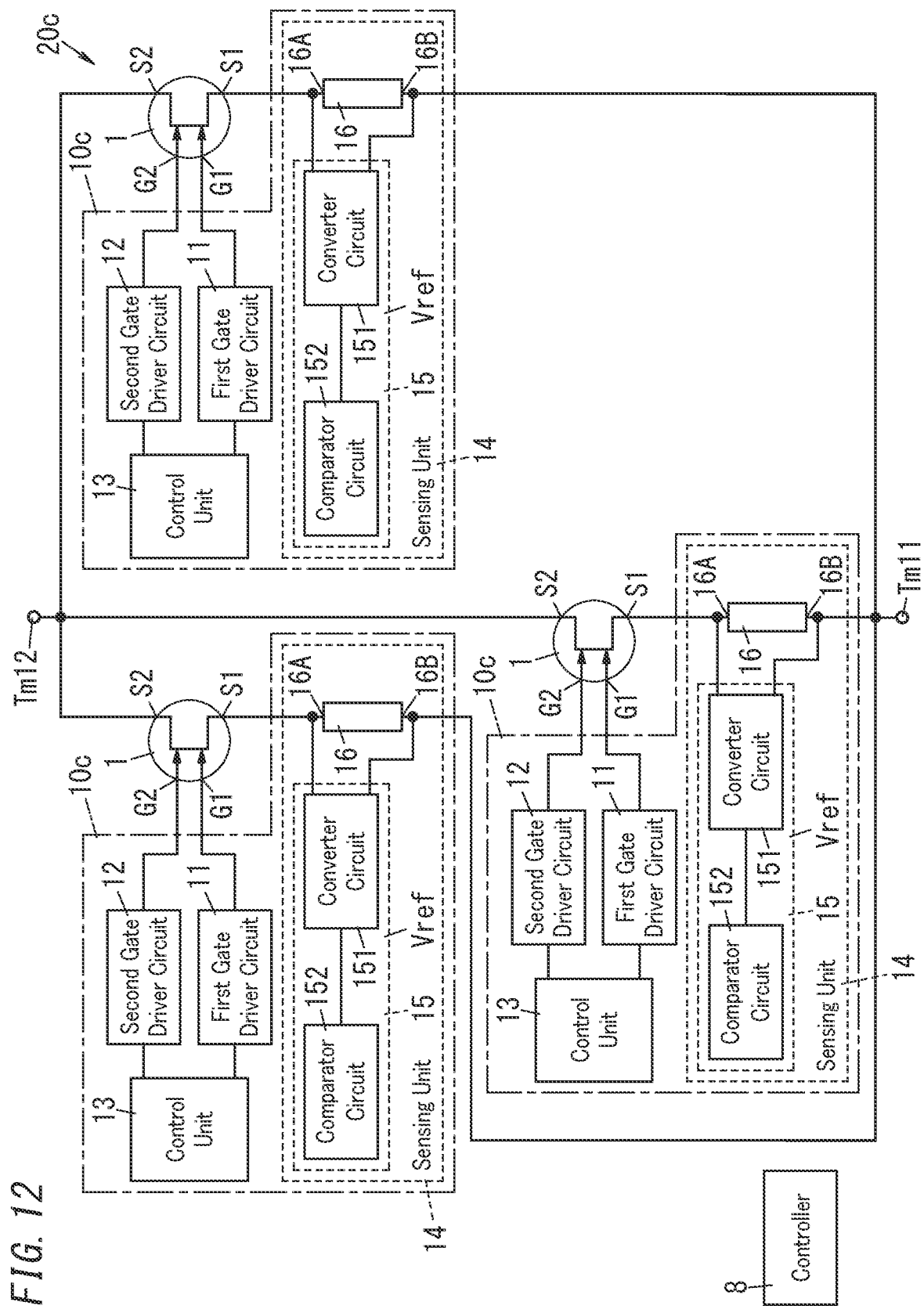
FIG. 12 is a circuit diagram of the switch system.

The switch system 20c according to the fourth embodiment includes a bidirectional switch 1, a first gate driver circuit 11, a second gate driver circuit 12, a control unit 13, and a sensing unit 14. The sensing unit 14 is connected to the bidirectional switch 1. In the switch system 20c, the sensing unit 14 is connected to the first source S1 of the bidirectional switch 1 to sense a current flowing between the first source S1 and the second source S2. The sensing unit 14 includes, for example, a current detecting resistor 16 connected to the bidirectional switch 1 in series as shown in FIG. 12. The resistor 16 has a first terminal 16A and a second terminal 16B. The first terminal 16A of the resistor 16 is connected to the first source S1 of the bidirectional switch 1. The second terminal 16B of the resistor 16 is connected to the first external connection terminal Tm11. This allows the sensing unit 14 to detect the current flowing through the resistor 16 by converting the current into a voltage across the resistor 16.

Figure 11:
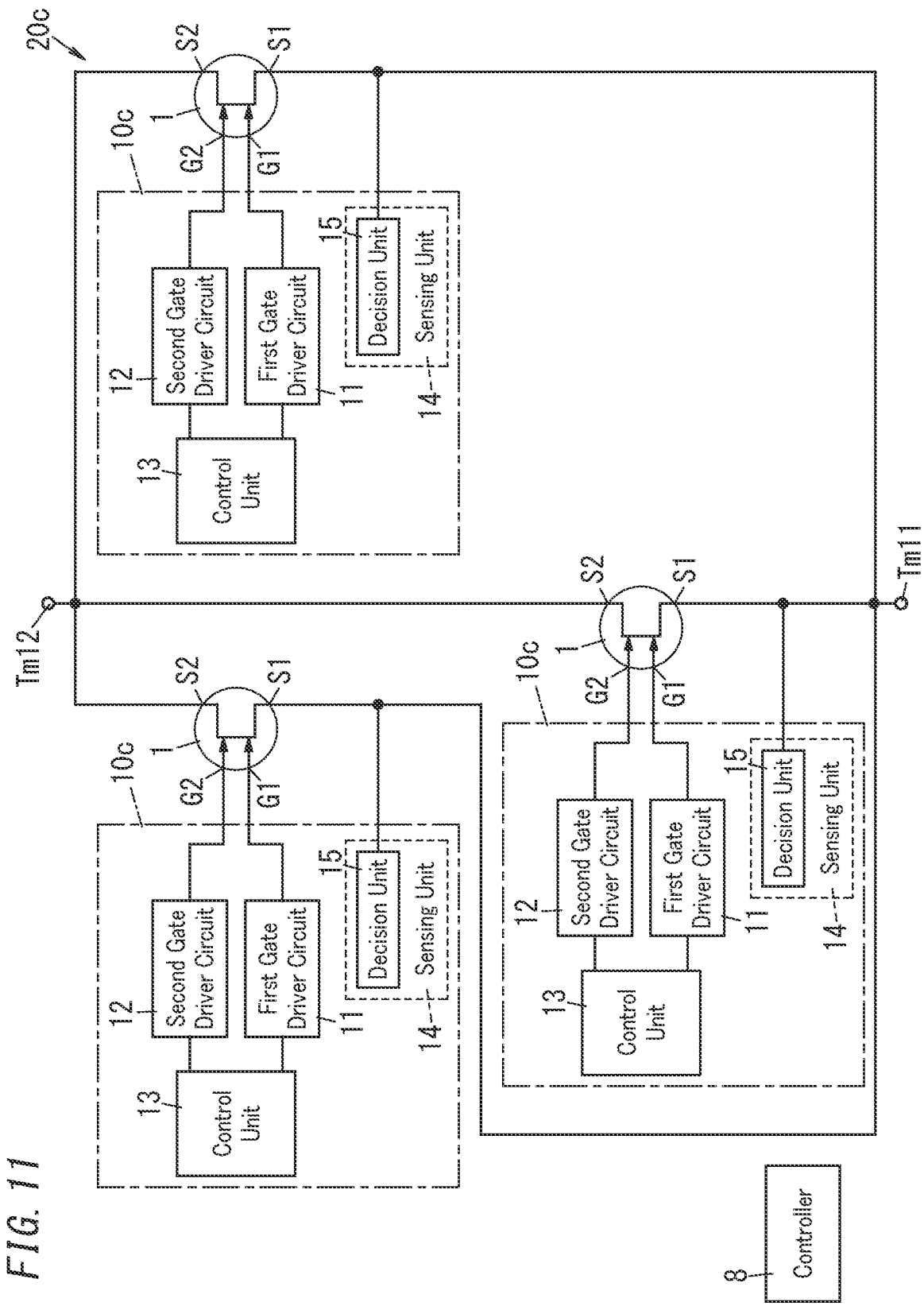
FIG. 11 is a circuit diagram of the switch system.

In addition, the sensing unit 14 further includes a decision unit 15 as shown in FIG. 11. The decision unit 15 determines whether or not the current flowing through the bidirectional switch 1 is less than a predetermined value. As shown in FIG. 12, the decision unit 15 may include, for example: a converter circuit 151 for converting the voltage across the resistor 16 into an absolute value; and a comparator circuit 152 for comparing the absolute value provided by the converter circuit 151 with a predetermined voltage. The comparator circuit 152 may be implemented as a comparator, for example. The predetermined voltage corresponds to the current value (e.g., 1 nA or less) of a leakage current that could flow through the bidirectional switch 1 in OFF state. This allows the decision unit 15 to determine, by comparing the absolute value of the voltage across the resistor 16 with a predetermined voltage, whether or not the current flowing through the bidirectional switch 1 is less than a predetermined value. This enables, no matter whether the direction of the current flowing through the bidirectional switch 1 is the first direction A1 (see FIG. 1) or the second direction A2 (see FIG. 1), determining whether or not the current flowing through the bidirectional switch 1 is less than the predetermined value.

The switch system 20c according to the fourth embodiment includes the sensing unit 14 instead of the first decision unit 21 and second decision unit 22 of the switch system 20b according to the third embodiment.

The switch system 20c includes multiple (e.g., three in the example illustrated in FIG. 10) sets, each including the bidirectional switch 1, the first gate driver circuit 11, the second gate driver circuit 12, the control unit 13, and the sensing unit 14. The switch system 20c also includes a controller 8 for controlling the plurality of (e.g., three in the example illustrated in FIG. 10) control units 13.

Each of the plurality of (e.g., three in the example illustrated in FIG. 10) sensing units 14 senses, when at least one of the plurality of bidirectional switches 1, other than the bidirectional switch 1 included in the same set as the sensing unit 14, is electrically conductive, the state of the bidirectional switch 1 included in the same set as the sensing unit 14 in each of a first state and a second state of the control unit 13 included in the same set as the sensing unit 14. The first state is a state where the control unit 13 included in the same set as the sensing unit 14 outputs a signal to turn OFF the first gate G1 of the bidirectional switch 1 included in the same set as the sensing unit 14 and outputs a signal to turn ON the second gate G2 thereof. The second state is a state where the control unit 13 included in the same set as the sensing unit 14 outputs a signal to turn OFF the second gate G2 of the bidirectional switch 1 included in the same set as the sensing unit 14.

A switch system 20c according to the fourth embodiment described above includes a bidirectional switch 1, a first gate driver circuit 11, a second gate driver circuit 12, a control unit 13, and a sensing unit 14. The bidirectional switch 1 includes a first source S1, a second source S2, a first gate G1 corresponding to the first source S1, and a second gate G2 corresponding to the second source S2. The first gate driver circuit 11 is connected to the first gate G1. The second gate driver circuit 12 is connected to the second gate G2. The control unit 13 controls the first gate driver circuit 11 and the second gate driver circuit 12. The sensing unit 14 is connected to the bidirectional switch 1. The switch system 20c includes multiple sets, each of which includes the bidirectional switch 1, the first gate driver circuit 11, the second gate driver circuit 12, the control unit 13, and the sensing unit 14, and therefore, includes a plurality of bidirectional switches 1 and a plurality of sensing units 14. In the switch system 20c, the plurality of bidirectional switches 1 are connected in parallel with each other. Each of the plurality of sensing units 14 senses, when at least one of the plurality of bidirectional switches 1, other than the bidirectional switch 1 included in the same set as the sensing unit 14, is electrically conductive, the state of the bidirectional switch 1 included in the same set as the sensing unit 14 in each of a state in a first operation mode and a state in a second operation mode. The state in the first operation mode is a state where the control unit 13 included in the same set as the sensing unit 14 outputs a signal to turn OFF the first gate G1 of the bidirectional switch 1 included in the same set as the sensing unit 14 and outputs a signal to turn ON the second gate G2 thereof. The state in the second operation mode is a state where the control unit 13 included in the same set as the sensing unit 14 outputs a signal to turn OFF the second gate G2 of the bidirectional switch 1 included in the same set as the sensing unit 14 and outputs a signal to turn ON the first gate G1 thereof.

The switch system 20c according to the fourth embodiment may sense the respective states of the plurality of bidirectional switches 1.

The switch system 20b according to the third embodiment determines the respective states of the first gate G1 and second gate G2 in each of the plurality of bidirectional switches 1. On the other hand, the switch system 20c according to the fourth embodiment may determine, with respect to each of the plurality of bidirectional switches 1, whether or not to interrupt the current. The switch system 20c determines, for example, by making the sensing unit 14 sense the current flowing through the first source S1 of each of the plurality of bidirectional switches 1 when the control unit 13 is in the first state and when the control unit 13 is in the second state in the bidirectional switch 1, whether or not the bidirectional switch 1 is electrically conductive. As for the decision about electrical conductivity, the bidirectional switch 1 is determined to be electrically conductive when the current sensed by the sensing unit 14 is equal to or greater than a first predetermined value and the bidirectional switch 1 is determined to be electrically non-conductive when the current sensed by the sensing unit 14 is less than a second predetermined value. The second predetermined value is less than the first predetermined value. The second predetermined value may be 1 nA, for example.

Each of the plurality of control units 13 has, in the first state, a state-sensing first OFF-state voltage applied to the first gate G1 of the bidirectional switch 1 included in the same set as the control unit 13 and has, in the second state, a state-sensing second OFF-state voltage applied to the second gate G2 of the bidirectional switch 1 included in the same set as the control unit 13. The voltage level of the first OFF-state voltage is different from the voltage level of the voltage to turn OFF the first gate G1 while the control unit 13 is performing a normal operation. The voltage level of the second OFF-state voltage is different from the voltage level of the voltage to turn OFF the second gate G2 while the control unit 13 is performing a normal operation. Note that the difference between the first threshold voltage and the first OFF-state voltage is greater than the voltage difference of the bidirectional switch 1. The difference between the second threshold voltage and the second OFF-state voltage is greater than the voltage difference of the bidirectional switch 1.

Figure 13:
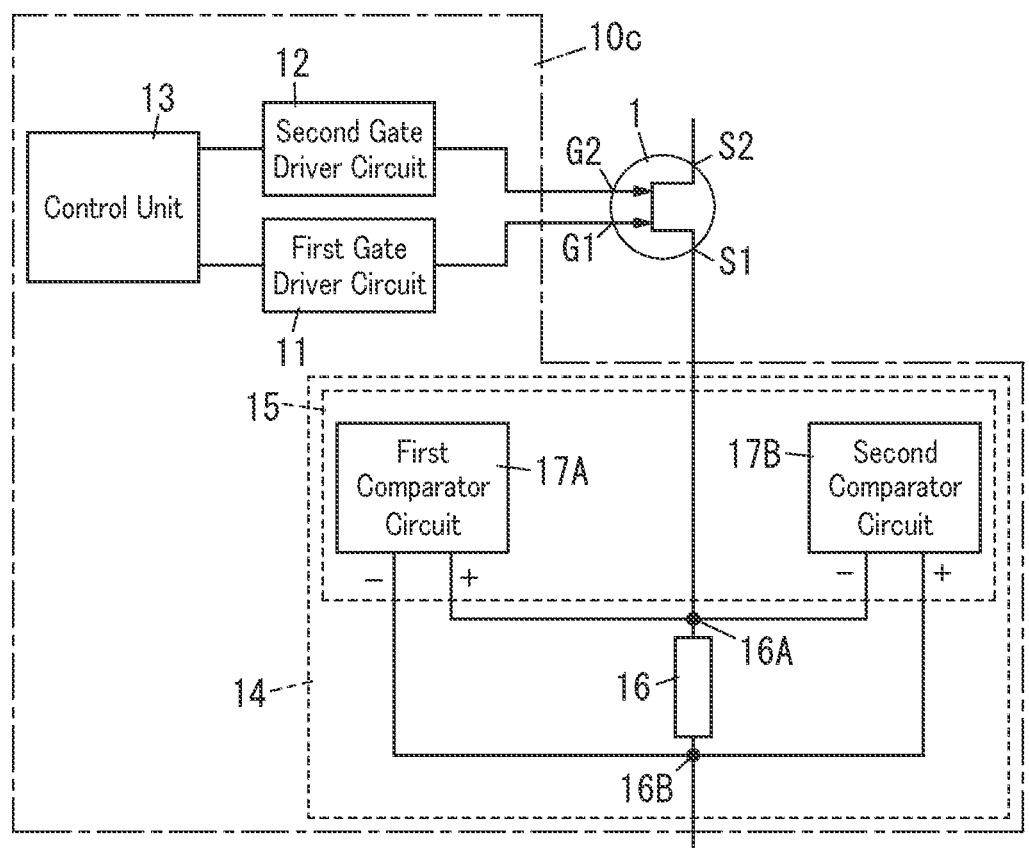
FIG. 13 is a circuit diagram of the switch system.

In the switch system 20c, each of the plurality of decision units 15 does not have to have the configuration shown in FIG. 12. Alternatively, each of the plurality of decision units 15 may include, for example: a first comparator circuit 17A for comparing a potential at a first terminal 16A of the resistor 16 with a potential at a second terminal 16B thereof used as a reference potential; and a second comparator circuit 17B for comparing the potential at the second terminal 16B of the resistor 16 with the potential at the first terminal 16A thereof used as a reference potential as shown in FIG. 13.

The first comparator circuit 17A includes a first comparator. In the first comparator circuit 17A, the first terminal 16A of the resistor 16 is connected to a non-inverting terminal of the first comparator and the second terminal 16B of the resistor 16 is connected to an inverting terminal of the first comparator. This allows the first comparator circuit 17A to determine, while the control unit 13 is outputting a signal to turn OFF the first gate G1 of the bidirectional switch 1 and a signal to turn ON the second gate G2 thereof, whether or not a current has flowed in the direction from the second source S2 of the bidirectional switch 1 toward the first source S1 thereof.

The second comparator circuit 17B includes a second comparator. In the second comparator circuit 17B, the second terminal 16B of the resistor 16 is connected to a non-inverting terminal of the second comparator and the first terminal 16A of the resistor 16 is connected to an inverting terminal of the second comparator. This allows the second comparator circuit 17B to determine, w % bile the control unit 13 is outputting a signal to turn OFF the second gate G2 of the bidirectional switch 1 and a signal to turn ON the first gate G1 thereof, whether or not a current has flowed in the direction from the first source S1 of the bidirectional switch 1 toward the second source S2 thereof.

In the following description, the potential at the first external connection terminal Tm11 will be hereinafter sometimes designated by Vs1 and the potential at the second external connection terminal Tm12 will be hereinafter sometimes designated by Vs2 for the sake of convenience of description.

If Vs2>Vs1 is satisfied, the switch system 20c according to the fourth embodiment may decide, on finding a source current flowing when a transition is made from a state where the control unit 13 outputs a signal to turn ON the first gate G1 and a signal to turn ON the second gate G2 to a second state where the control unit 13 outputs a signal to turn OFF the second gate G2 and a signal to turn ON the first gate G1, that the second gate G2 that is the gate with the higher potential should be abnormal. On the other hand, the switch system 20c may decide, on finding no source current (i.e., a current flowing from the second source S2 toward the first source S1) flowing at the time of the transition, that the second gate G2 should be normal.

Also, if Vs2>Vs1 is satisfied, the switch system 20c according to the fourth embodiment may decide, on finding a source current flowing when a transition is made from a state where the control unit 13 outputs a signal to turn ON the first gate G1 and a signal to turn ON the second gate G2 to a first state where the control unit 13 outputs a signal to turn OFF the first gate G1 and a signal to turn ON the second gate G2, that the first gate G1 that is the gate with the lower potential should be abnormal. On the other hand, the switch system 20c may decide, on finding no source current flowing at the time of the transition, that the first gate G1 should be normal.

In each of the case where Vs2>Vs1 is satisfied and the case where Vs2<Vs1 is satisfied, the switch system 20c preferably determines whether or not a current (i.e., a source current) has flowed and sees if the current may be blocked bidirectionally.

If Vs2>Vs1 is satisfied, a decision may be made directly whether or not the bidirectional switch 1 may turn OFF the source current (i.e., whether or not the source current becomes smaller than a predetermined value) by turning OFF the first gate G1 that is the gate with the lower potential, while a decision may be made only indirectly from the diode mode (i.e., a decision is made whether or not a transition is made to the diode mode) as for the second gate G2. Therefore, if Vs2<Vs1 is satisfied, a decision is preferably made whether or not the bidirectional switch 1 may turn OFF the source current by turning OFF the second gate G2. In short, a decision is preferably made, to say least, for each of the situation where Vs2>Vs1 is satisfied and the situation where Vs2<Vs1 is satisfied, whether or not the source current becomes smaller than the predetermined value when the gate with the lower potential is turned OFF.

Fifth Embodiment

Figure 14:
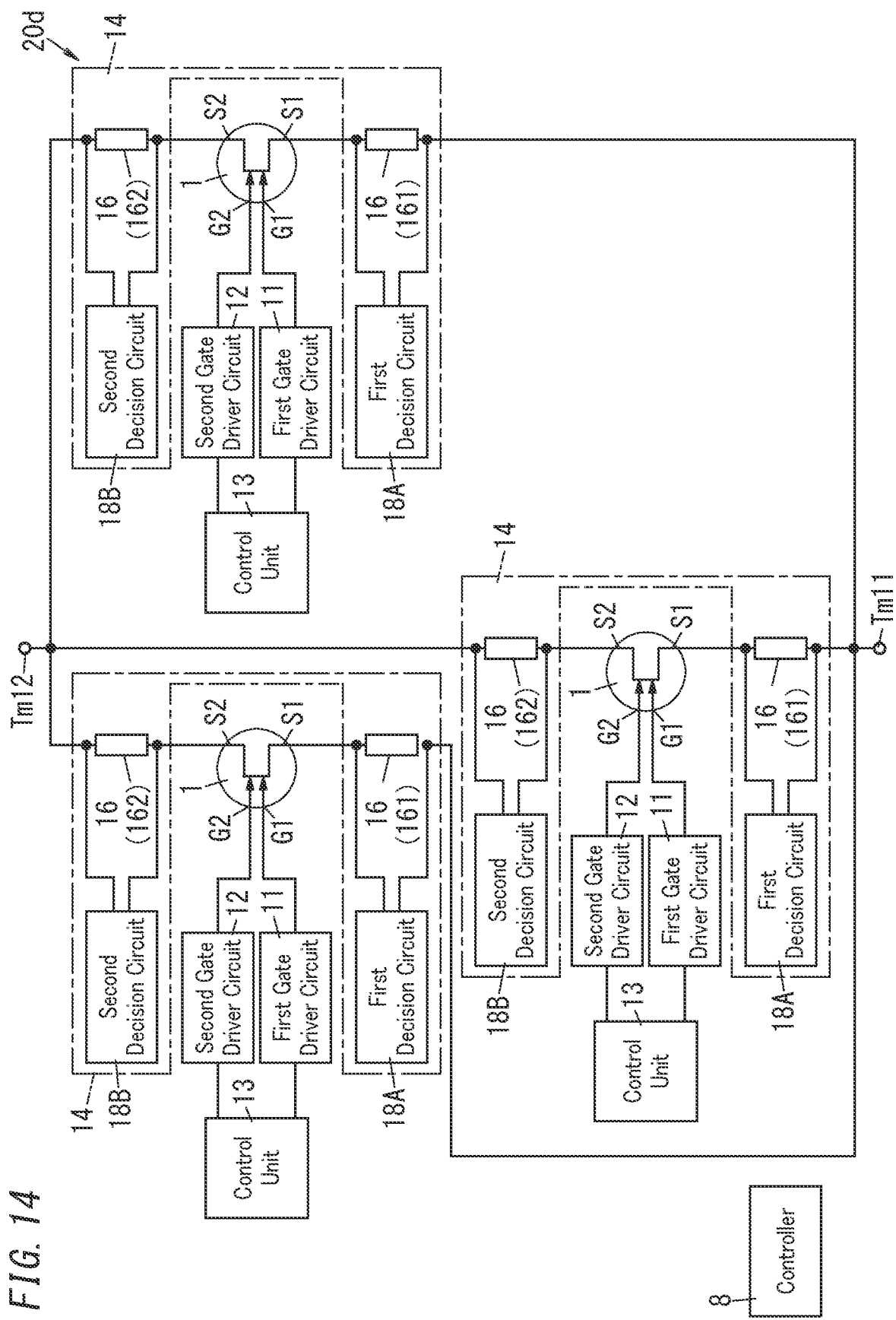
FIG. 14 is a circuit diagram of a switch system according to a fifth embodiment.

A switch system 20d according to a fifth embodiment will be described with reference to FIG. 14. In the following description, any constituent element of the switch system 20d according to this fifth embodiment, having the same function as a counterpart of the switch system 20c according to the fourth embodiment described above, will be designated by the same reference numeral as that counterpart's, and description thereof will be omitted herein as appropriate.

In the switch system 20d according to the fifth embodiment, each of the plurality of sensing units 14 includes two resistors 16. The two resistors 16 are a first resistor 161 connected to the first source S1 of the bidirectional switch 1 included in the same set as the sensing unit 14 and a second resistor 162 connected to the second source S2 of the bidirectional switch 1 included in the same set as the sensing units 14.

In the switch system 20d according to the fifth embodiment, each of the plurality of sensing units 14 includes a first decision circuit 18A and a second decision circuit 18B. The first decision circuit 18A decides, when finding the voltage across the first resistor 161 higher than a first reference voltage w % ben the control unit 13 included in the same set as the sensing unit 14 is in the first state, that the state of the first gate G1 should be abnormal. On the other hand, the second decision circuit 18B decides, when finding the voltage across the second resistor 162 higher than a second reference voltage when the control unit 13 included in the same set as the sensing unit 14 is in the second state, that the state of the second gate G2 should be abnormal. The first state is a state where the control unit 13 included in the same set as the sensing unit 14 outputs a signal to turn OFF the first gate G1 of the bidirectional switch 1 included in the same set as the sensing unit 14 and a signal to turn ON the second gate G2 thereof. The second state is a state where the control unit 13 included in the same set as the sensing unit 14 outputs a signal to turn OFF the second gate G2 of the bidirectional switch 1 included in the same set as the sensing unit 14 and a signal to turn ON the first gate G1 thereof.

The first decision circuit 18A includes a comparator for comparing, for example, the voltage across the first resistor 161 with a first reference voltage. This allows the first decision circuit 18A to determine whether or not while the control unit 13 is outputting a signal to turn OFF the first gate G1 of the bidirectional switch 1 and a signal to turn ON the second gate G2 thereof, a current has flowed in the direction from the second source S2 of the bidirectional switch 1 toward the first source S1 thereof.

The second decision circuit 18B includes a comparator for comparing, for example, the voltage across the second resistor 162 with a second reference voltage. This allows the second decision circuit 18B to determine whether or not while the control unit 13 is outputting a signal to turn OFF the second gate G2 of the bidirectional switch 1 and a signal to turn ON the first gate G1 thereof, a current has flowed in the direction from the first source S1 of the bidirectional switch 1 toward the second source S2 thereof.

Sixth Embodiment

Figure 15:
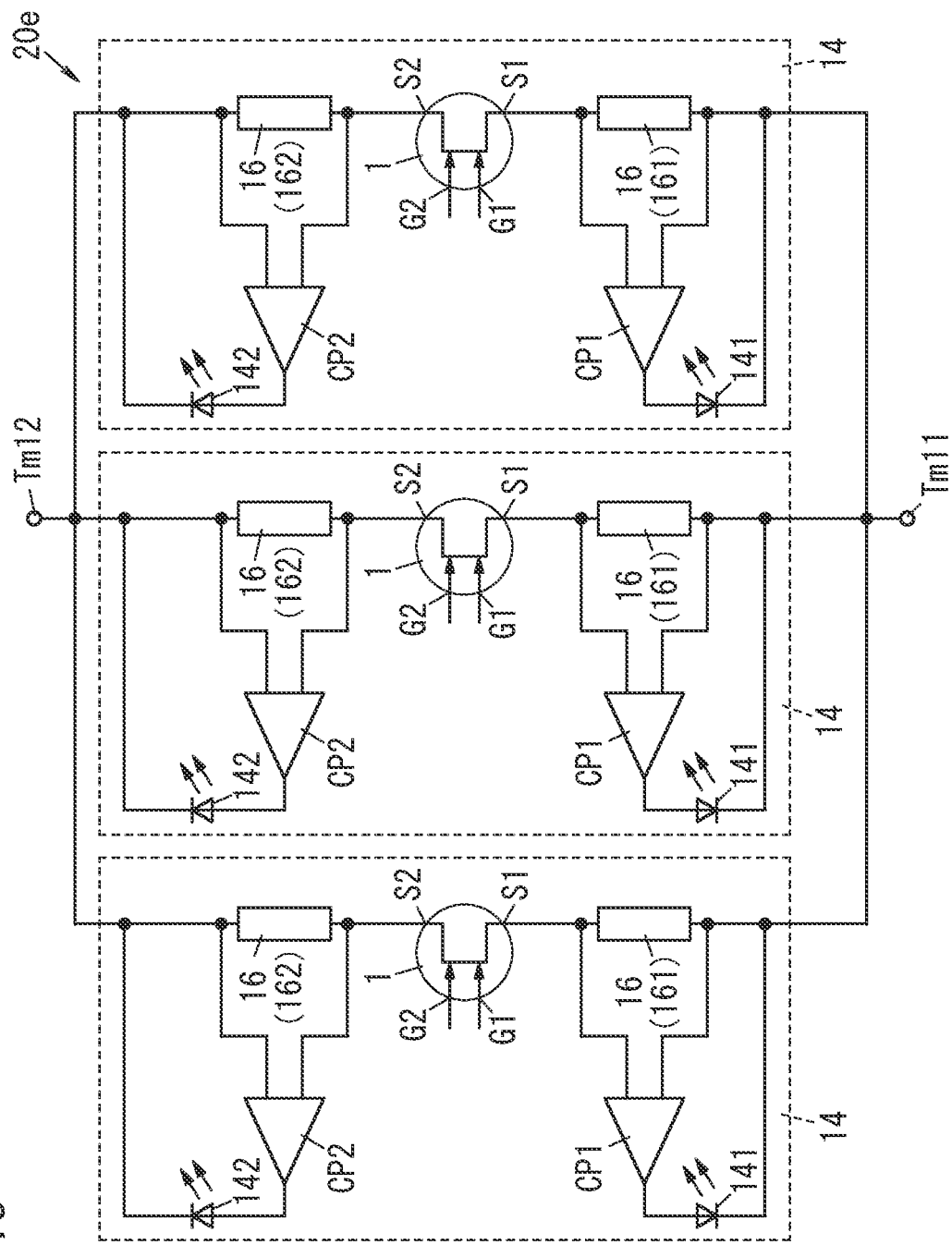
FIG. 15 is a circuit diagram of a switch system according to a sixth embodiment.

A switch system 20e according to a sixth embodiment will be described with reference to FIG. 15. In the following description, any constituent element of the switch system 20e according to this sixth embodiment, having the same function as a counterpart of the switch system 20d according to the fifth embodiment described above, will be designated by the same reference numeral as that counterpart's, and description thereof will be omitted herein as appropriate.

In the switch system 20e according to the sixth embodiment, each of the plurality of sensing units 14 includes a first comparator CP1, a second comparator CP2, a first light-emitting diode 141, and a second light-emitting diode 142. A non-inverting terminal of the first comparator CP1 is connected to a first terminal, provided on the same side as the first source S1, of the first resistor 161, while an inverting terminal of the first comparator CP1 is connected to a second terminal, opposite from the first terminal, of the first resistor 161. A non-inverting terminal of the second comparator CP2 is connected to a first terminal, provided on the same side as the second source S2, of the second resistor 162, while an inverting terminal of the second comparator CP2 is connected to a second terminal, opposite from the first terminal, of the second resistor 162. An anode of the first light-emitting diode 141 is connected to an output terminal of the first comparator CP1. A cathode of the first light-emitting diode 141 is connected to the second terminal of the first resistor 161. An anode of the second light-emitting diode 142 is connected to an output terminal of the second comparator CP2. A cathode of the second light-emitting diode 142 is connected to the second terminal of the second resistor 162.

In the switch system 20e according to the sixth embodiment, while a current is flowing from the second source S2 of the bidirectional switch 1 toward the first source S1 thereof, the first light-emitting diode 141 emits light. On the other hand, while a current is flowing from the first source S1 of the bidirectional switch 1 toward the second source S2 thereof, the second light-emitting diode 142 emits light. Also, in the switch system 20e according to the sixth embodiment, while no current is flowing through the bidirectional switch 1, both the first light-emitting diode 141 and the second light-emitting diode 142 are extinct.

Seventh Embodiment

Figure 16:
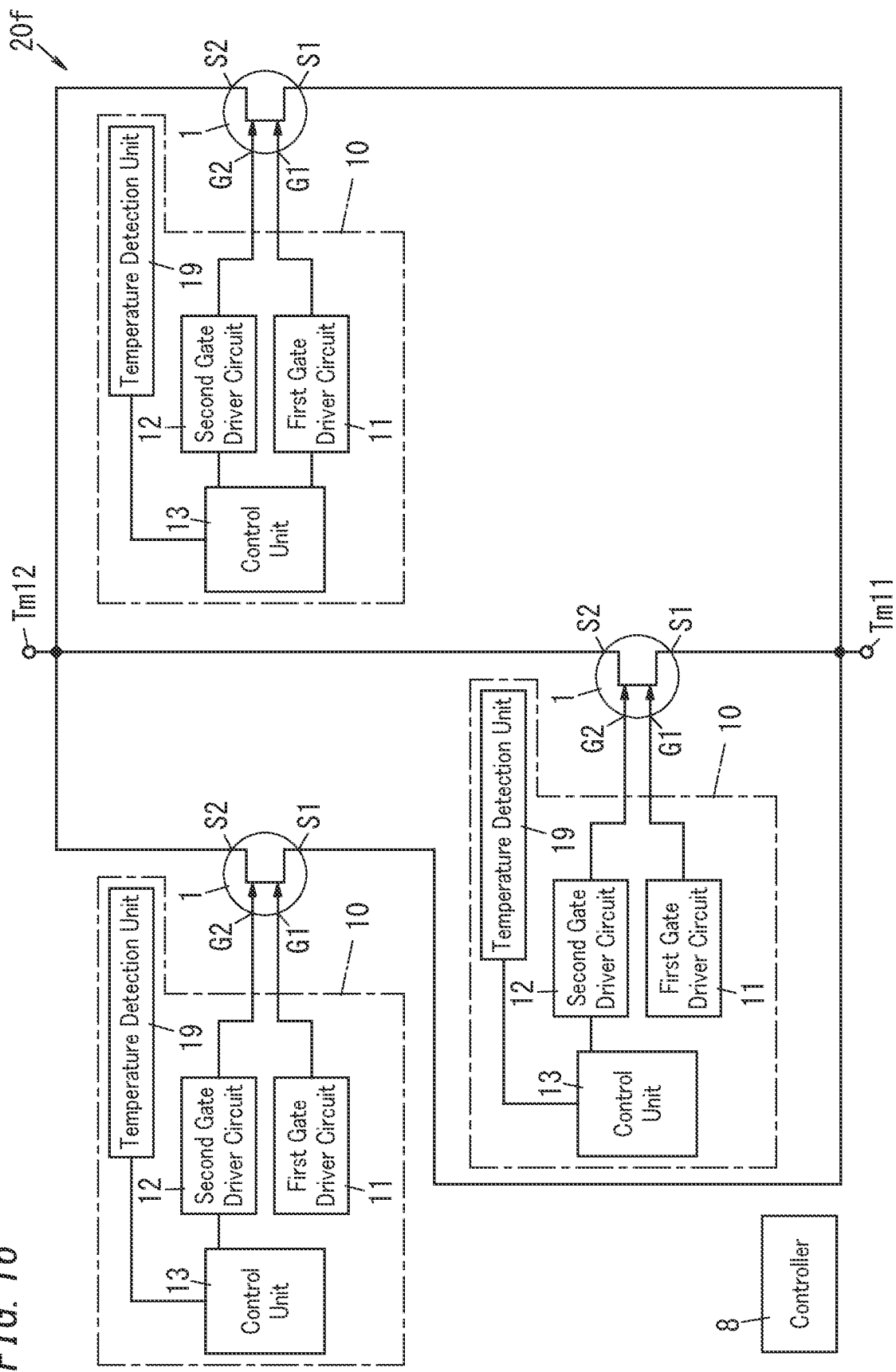
FIG. 16 is a circuit diagram of a switch system according to a seventh embodiment.

A switch system 20f according to a seventh embodiment will be described with reference to FIG. 16. In the following description, any constituent element of the switch system 20f according to this seventh embodiment, having the same function as a counterpart of the switch system 20c according to the fourth embodiment described above, will be designated by the same reference numeral as that counterpart's, and description thereof will be omitted herein as appropriate.

In the switch system 20f, each of the plurality of sensing units 14 includes a temperature detection unit 19 for detecting the temperature of the bidirectional switch 1 included in the same set as the sensing unit 14.

Each of the plurality of sensing units 14 determines, when finding the temperature detected by the temperature detection unit 19 higher than a threshold temperature while the control unit 13 included in the same set as the sensing unit 14 is in the first state, the bidirectional switch 1 included in the same set as the sensing unit 14 to be operating improperly. The first state is a state where the control unit 13 outputs a signal to turn OFF the first gate G1 of the bidirectional switch 1 included in the same set as the sensing unit 14 and a signal to turn ON the second gate G2 thereof. If the first gate G1 of the bidirectional switch 1 is turned OFF while the control unit 13 is in the first state, then the quantity of heat generated by the bidirectional switch 1 decreases.

Each of the plurality of sensing units 14 also determines, when finding the temperature detected by the temperature detection unit 19 higher than the threshold temperature while the control unit 13 included in the same set as the sensing unit 14 is in the second state, the bidirectional switch 1 included in the same set as the sensing unit 14 to be operating improperly. The second state is a state where the control unit 13 included in the same set as each of the plurality of sensing units 14 outputs a signal to turn ON the first gate G1 of the bidirectional switch 1 included in the same set as the sensing unit 14 and a signal to turn OFF the second gate G2 thereof. If the second gate G2 of the bidirectional switch 1 is turned OFF while the control unit 13 is in the second state, then the quantity of heat generated by the bidirectional switch 1 decreases.

The switch system 20f according to the seventh embodiment may determine, based on a variation in the temperature of the bidirectional switch 1, whether or not there is any abnormality about the current flowing through the bidirectional switch 1.

Eighth Embodiment

Figure 17:
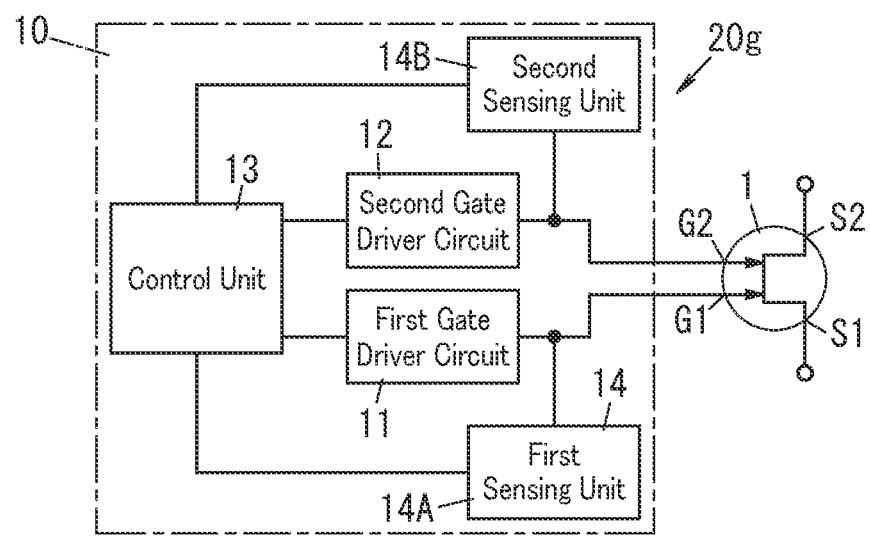
FIG. 17 is a circuit diagram of a switch system according to an eighth embodiment.

A switch system 20g according to an eighth embodiment will be described with reference to FIGS. 17 and 18. In the following description, any constituent element of the switch system 20g according to this eighth embodiment, having the same function as a counterpart of the switch system 20b according to the third embodiment described above, will be designated by the same reference numeral as that counterpart's, and description thereof will be omitted herein as appropriate.

In the switch system 20g according to the eighth embodiment, each of the plurality of bidirectional switches 1 is a normally-off JFET of which the first gate G1 includes a first p-type layer 191 and a first gate electrode 181 and the second gate G2 includes a second p-type layer 192 and a second gate electrode 182 as described above with reference to FIG. 2.

In the switch system 20g according to the eighth embodiment, each of the plurality of sensing units 14 includes a first sensing unit 14A and a second sensing unit 14B.

The first sensing unit 14A senses, while the control unit 13 included in the same set as the sensing unit 14A is in the second state, the power distribution state between the first source S1 and second source S2 of the bidirectional switch 1 included in the same set as the sensing unit 14A based on the voltage at the first gate G1. The second state is a state where the control unit 13 included in the same set as the sensing unit 14A outputs a signal to turn OFF the second gate G2 of the bidirectional switch 1 included in the same set as the sensing unit 14A and a signal to turn ON the first gate G1 thereof.

The second sensing unit 14B senses, while the control unit 13 included in the same set as the sensing unit 14B is in the first state, the power distribution state between the first source S1 and second source S2 of the bidirectional switch 1 included in the same set as the sensing unit 14B based on the voltage at the second gate G2. The first state is a state where the control unit 13 included in the same set as the sensing unit 14B outputs a signal to turn OFF the first gate G1 of the bidirectional switch 1 included in the same set as the sensing unit 14B and a signal to turn ON the second gate G2 thereof.

In the switch system 20g, each of the plurality of first gate driver circuits 11 includes a first gate resistor Rg1 (see FIG. 4) connected to the first gate G1 of the bidirectional switch 1 included in the same set as the first gate driver circuit 11. Each of the plurality of second gate driver circuits 12 includes a second gate resistor Rg2 (see FIG. 4) connected to the second gate G2 of the bidirectional switch 1 included in the same set as the second gate driver circuit 12. Each of the plurality of first sensing units 14A determines, when finding the voltage across the first gate resistor Rg1 connected to the bidirectional switch 1 included in the same set as the first sensing unit 14 higher than a first predetermined voltage (e.g., a predetermined voltage Vth), the bidirectional switch 1 included in the same set as the first sensing unit 14 to be operating improperly.

Each of the plurality of second sensing units 14B determines, when finding the voltage across the second gate resistor R2 connected to the bidirectional switch 1 included in the same set as the second sensing unit 14B higher than a second predetermined voltage (e.g., a predetermined voltage Vth), the bidirectional switch 1 included in the same set as the second sensing unit 14B to be operating improperly.

Figure 18:
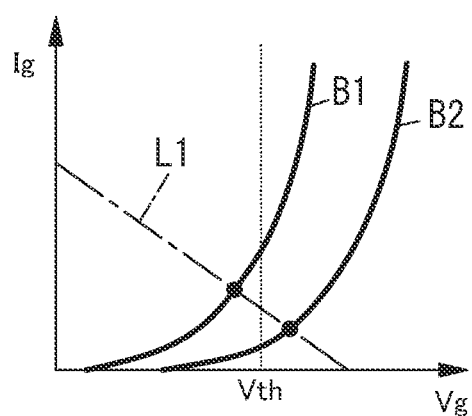
FIG. 18 is a graph showing gate voltage-gate current characteristics of a dual-gate bidirectional switch included in the switch system.

The bidirectional switch 1 implemented as a dual-gate GaN-based GIT has a voltage-current characteristic as shown in FIG. 18, supposing that the gate voltage applied between the gate (e.g., the first gate G1) and the source (e.g., the first source S1) is designated by Vg and the gate current flowing through the gate is designated by Ig. In FIG. 18, the solid curve B2 represents a voltage-current characteristic in a situation where the temperature is lower than the situation represented by the solid curve B1. Also, in FIG. 18, a resistance load line L1 is indicated by the one-dot chain. The predetermined voltage Vth is a voltage between a gate voltage corresponding to an intersection between the solid curve B1 and the load resistance line L1 and a gate voltage corresponding to an intersection between the solid curve B2 and the load resistance line L1.

Ninth Embodiment

A switch system 20h according to a ninth embodiment will be described with reference to FIGS. 19-23. In the following description, any constituent element of the switch system 20h according to this ninth embodiment, having the same function as a counterpart of the switch system 20 according to the first embodiment described above, will be designated by the same reference numeral as that counterpart's, and description thereof will be omitted herein as appropriate.

(1) Switch System (Interrupter)

The switch system 20h according to the ninth embodiment includes a bidirectional switch 1 implemented as a semiconductor switch, a first gate driver circuit 11, a second gate driver circuit 12, and a diagnosis device 3. The switch system 20h is an interrupter configured to make the bidirectional switch 1 open and close a power feeding path 80 leading from the power supply 7 to the load 9.

The power supply 7 is a DC power supply such as a solar battery or a storage battery. Alternatively, the power supply 7 may also be, for example, a power converter for converting AC power supplied from a commercial AC power supply into DC power.

The load 9 is preferably, for example, an electric motor and a driver for driving the electric motor or a power conditioner for converting DC power supplied from a solar battery into AC power.

(2) Semiconductor Switch (2.1) Structure of Semiconductor Switch

The bidirectional switch 1 implemented as a semiconductor switch is preferably able to interrupt a current independently of each other in two directions, namely, a first direction A1 and a second direction A2. The semiconductor switch according to the ninth embodiment is a dual-gate bidirectional switch 1 with two gate and source pairs. Specifically, the bidirectional switch 1 is a dual-gate GaN-based gate injection transistor (GIT).

The bidirectional switch 1 is a normally-on JFET including the first p-type layer 191 and the second p-type layer 192. In the bidirectional switch 1, the first threshold voltage Vth1 may be −8 V, for example, and the second threshold voltage Vth2 may be −8 V, for example. Alternatively, the bidirectional switch 1 may have a structure which includes neither the first p-type layer 191 nor the second p-type layer 192 and in which the first gate electrode 181 of the first gate G1 and the second gate electrode 182 of the second gate G2 form Schottky junction with respect to the second nitride semiconductor layer 105 configured as an undoped AlGaN layer.

(2.2) Operation of Bidirectional Switch

The bidirectional switch 1 is a normally-on WET. Thus, the bidirectional switch 1 turns OFF when the first gate G1 and the second gate G2 are reverse biased, i.e., when the first gate G1 is reverse biased such that the potential at the first gate G1 becomes less than the first threshold voltage Vth1 with respect to the potential Vs1 at the first source S1 and the second gate G2 is reverse biased such that the potential at the second gate G2 becomes less than the second threshold voltage Vth2 with respect to the potential at the second source S2.

In the following description, a state where a voltage equal to or higher than the first threshold voltage Vth1 is applied between the first source S1 and the first gate G1 with respect to the first source S1 defined as a reference (i.e., a state where the first gate G1 is not reverse biased) will be hereinafter referred to as an "ON state of the first gate G1" for the sake of convenience of description. Also, a state where a voltage lower than the first threshold voltage Vth1 is applied between the first source S1 and the first gate G1 with respect to the first source S1 defined as a reference (i.e., a state where the first gate G1 is reverse biased) will be hereinafter referred to as an "OFF state of the first gate G1." Furthermore, a state where a voltage equal to or higher than the second threshold voltage Vth2 is applied between the second source S2 and the second gate G2 with respect to the second source S2 defined as a reference (i.e., a state where the second gate G2 is not reverse biased) will be hereinafter referred to as an "ON state of the second gate G2." Furthermore, a state where a voltage lower than the second threshold voltage Vth2 is applied between the second source S2 and the second gate G2 with the second source S2 sets as a reference (i.e., a state where the second gate G2 is reverse biased) will be hereinafter referred to as an "OFF state of the second gate G2."

The bidirectional switch 1 allows, in a state where the first gate G1 is ON and the second gate G2 is ON (i.e., in a bidirectionally ON state), a current to flow bidirectionally both in the first direction A1 and the second direction A2 between the first source S1 and the second source S2. More specifically, in the bidirectional switch 1 in the bidirectionally ON state, a current flows in the first direction A1 when the first source S1 has a higher potential than the second source S2. Also, in the bidirectional switch 1 in the bidirectionally ON state, a current flows in the second direction A2 when the second source S2 has a higher potential than the first source S1.

The bidirectional switch 1 cannot allow, in a state where the first gate G1 is OFF and the second gate G2 is OFF (i.e., in a bidirectionally OFF state), a current to flow bidirectionally both in the first direction A1 and the second direction A2 between the first source S1 and the second source S2. More specifically, in the bidirectional switch 1 in the bidirectionally OFF state, a current flowing in the first direction A1 is interrupted when the first source S1 has a higher potential than the second source S2. On the other hand, a current flowing in the second direction A2 is interrupted when the second source S2 has a higher potential than the first source S1.

The bidirectional switch 1 functions as a diode when the first gate G1 is ON and the second gate G2 is OFF (i.e., in a second diode state). More specifically, in the bidirectional switch 1 in the second diode state, a current flows in the second direction A2 when the second source S2 has a higher potential than the first source SL. On the other hand, the current flowing in the first direction A1 is interrupted when the first source S1 has a higher potential than the second source S2.

The bidirectional switch 1 functions as a diode when the first gate G1 is OFF and the second gate G2 is ON (i.e., in a first diode state). More specifically, in the bidirectional switch 1 in the first diode state, a current flows in the first direction A1 when the first source S1 has a higher potential than the second source S2. On the other hand, the current flowing in the second direction A2 is interrupted when the second source S2 has a higher potential than the first source S1.

In the bidirectional switch 1 according to the ninth embodiment, the first threshold voltage and the second threshold voltage may or may not be equal to each other.

An interrupter implemented as the switch system 20h described above may reduce the power consumed by the bidirectional switch 1 while power is being supplied from the power supply 7 to the load 9 to approximately zero, because the bidirectional switch 1 is a normally-on type. In addition, the interrupter may also interrupt the current flowing from the power supply 7 to the load 9 (in the first direction A1) when the load 9 comes to have some abnormality, for example. Furthermore, the interrupter may also interrupt the current flowing in the reverse direction from the load 9 to the power supply 7 (in the second direction A2) when the power supply 7 comes to have some abnormality, because the semiconductor switch connected between the power supply 7 and the load 9 is the bidirectional switch 1.

(3) Gate Driver Circuit

Figure 19:
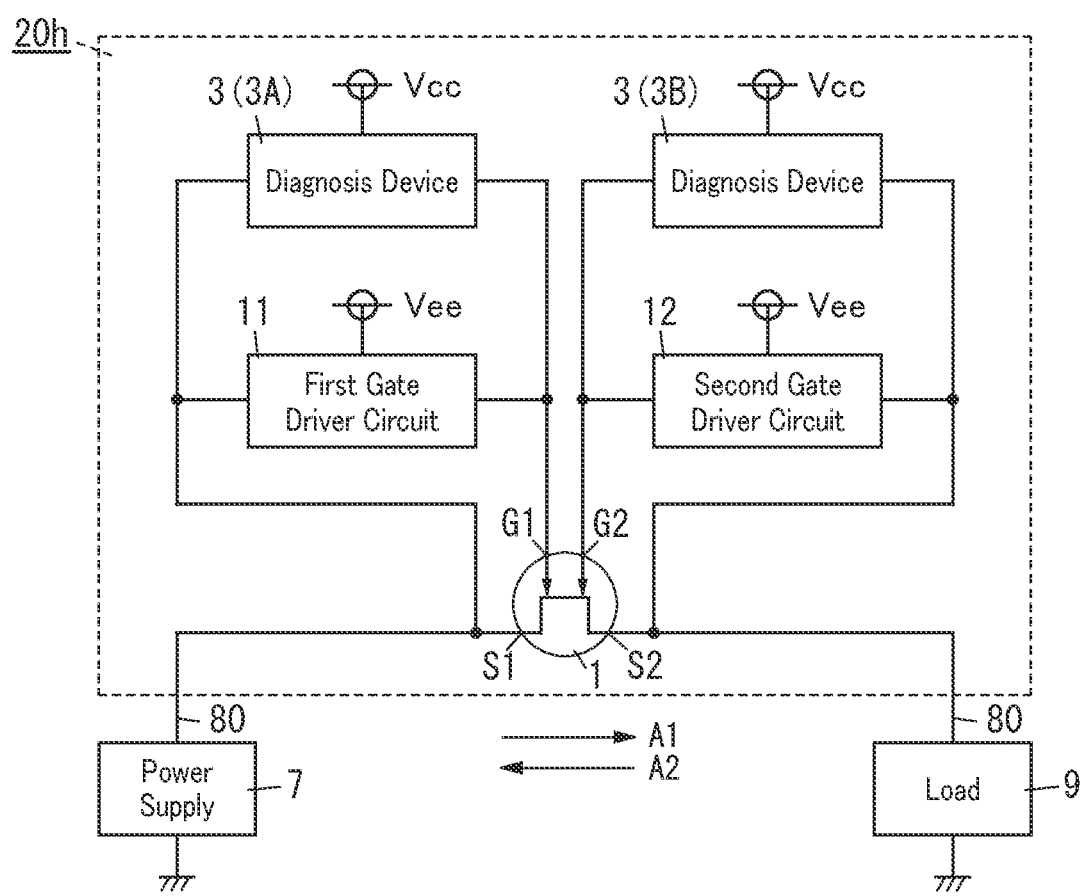
FIG. 19 is a block diagram of a switch system (interrupter) according to a ninth embodiment.

The switch system 20h includes two gate driver circuits, namely, the first gate driver circuit 11 and the second gate driver circuit 12 (see FIG. 19).

Figure 20:
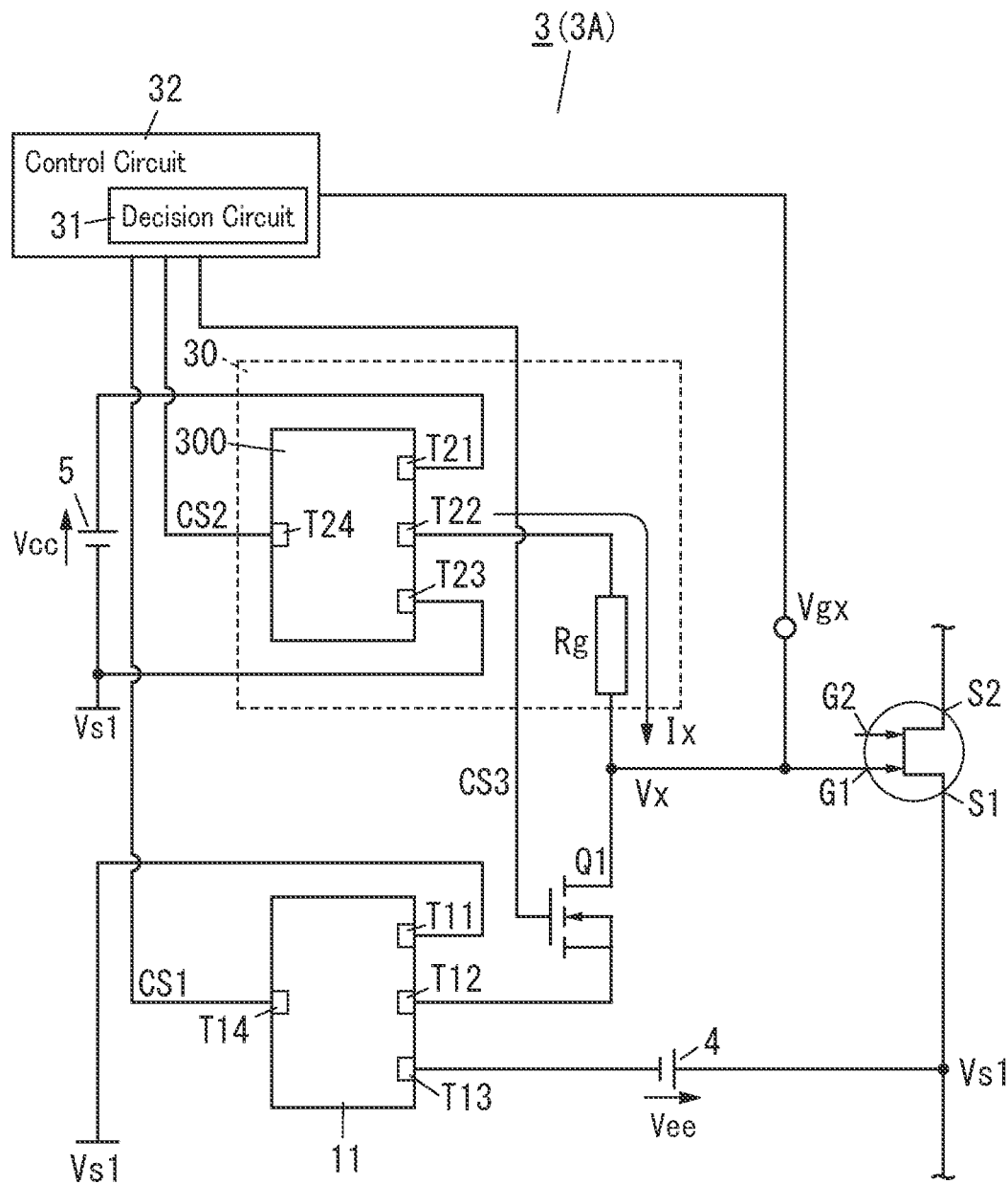
FIG. 20 illustrates a partially omitted circuit configuration for the switch system.

The first gate driver circuit 11 is implemented as an integrated circuit including a power supply terminal T11, an output terminal T12, a ground terminal T13, and a signal input terminal T14 as shown in FIG. 20. This integrated circuit is an insulated gate driver IC (integrated circuit). The ground terminal T13 of the first gate driver circuit 11 receives a differential voltage (Vs1−Vee) representing the difference between the potential at the first source S1 and the supply voltage Vee of a negative power supply 4. The power supply terminal T11 of the first gate driver circuit 11 is electrically connected to the first source S1 of the bidirectional switch 1 (see FIGS. 19 and 20). That is to say, the power supply terminal T11 of the first gate driver circuit 11 receives the supply voltage Vee of the negative power supply 4 with the potential (Vs1−Vee) at the ground terminal T13 defined as a reference (see FIG. 20). The output terminal T12 of the first gate driver circuit 11 is electrically connected to the first gate G1 via a switching element Q1. The signal input terminal T14 of the first gate driver circuit 11 receives a control signal from a control circuit 32 to be described later. The negative power supply 4 is a DC power supply and has its negative electrode connected to the ground terminal T13 of the first gate driver circuit 11 and its positive electrode connected to the first source S1. This allows the first gate driver circuit 11 to apply, between the first gate G1 and first source S1 of the bidirectional switch 1, a negative bias voltage (i.e., a negative voltage less than the first threshold voltage Vth1), which causes the first gate G1 to have the lower potential with respect to the first source S1 defined as a reference.

The switching element Q1 is an enhancement mode n-channel MOSFET (metal-oxide semiconductor field effect transistor). The source of the switching element Q1 is electrically connected to the output terminal T12 of the first gate driver circuit 11. The drain of the switching element Q1 is electrically connected to the first gate G1. The gate of the switching element Q1 is electrically connected to the control circuit 32. The switching element Q1 is turned ON and OFF (i.e., switched) by the control circuit 32. That is to say, when the switching element Q1 is in ON state, the output terminal T12 of the first gate driver circuit 11 is electrically conductive with the first gate G1 via the switching element Q1. On the other hand, when the switching element Q1 is in OFF state, the output terminal T12 of the first gate driver circuit 11 is prevented from becoming electrically conductive with the first gate G1 by the switching element Q1.

The first gate driver circuit 11 is controlled by the control circuit 32 to selectively switch the voltage at the output terminal T12 (i.e., output voltage) from a voltage (of −10 V, for example), of which the absolute value is greater than that of the first threshold voltage Vth1, to a voltage (of 0 V, for example), of which the absolute value is less than that of the first threshold voltage Vth1, or vice versa. That is to say, when the first gate driver circuit 11 switches the output voltage of the output terminal T12 to a voltage, of which the absolute value is less than that of the first threshold voltage Vth1, the first gate G1 of the bidirectional switch 1 turns ON. On the other hand, when the first gate driver circuit 11 outputs, through the output terminal T12, a voltage, of which the absolute value is greater than that of the first threshold voltage Vth1, the first gate G1 of the bidirectional switch 1 turns OFF.

Note that the second gate driver circuit 12 has the same circuit configuration as the first gate driver circuit 11. That is to say, the second gate driver circuit 12, as well as the first gate driver circuit 11, is controlled by the control circuit 32 and configured to be selectively turn ON or OFF the second gate G2.

(4) Diagnosis Device

The diagnosis device 3 includes a diagnosis device 3A for making a failure diagnosis on the set including the first gate G1 and the first source S1 and a diagnosis device 3B for making a failure diagnosis on the set including the second gate G2 and the second source S2 (see FIG. 19). These two diagnosis devices 3A, 3B have the same configuration, and therefore, the following description will be focused on only the diagnosis device 3 (3A) for making a failure diagnosis on the set including the first gate G1 and the first source S1.

The diagnosis device 3 includes a voltage application circuit 30, a decision circuit 31, and the control circuit 32 (see FIG. 20). Optionally, the control circuit 32 may be shared in common by the two diagnosis devices 3A, 3B. In that case, in the switch system 20h according to the ninth embodiment, the control circuit 32 constitutes a control unit for controlling the first gate driver circuit 11 and the second gate driver circuit 12.

(4.1) Voltage Application Circuit

The voltage application circuit 30 includes an integrated circuit 300 and a resistor Rg serving as a gate resistor. The integrated circuit 300 includes a power supply terminal T21, an output terminal T22, a ground terminal T23, and a signal input terminal T24 as shown in FIG. 20.

The integrated circuit 300 is preferably implemented as, for example, an insulated gate driver IC. The ground terminal T23 of the integrated circuit 300 is electrically connected to the first source S1 (see FIG. 20). That is to say, the ground terminal T23 of the integrated circuit 300 receives the potential Vs1 at the first source S1. The power supply terminal T21 of the integrated circuit 300 is electrically connected to the first source S1 of the bidirectional switch 1 via a positive power supply 5 (see FIG. 20). That is to say, the power supply terminal T21 of the integrated circuit 300 receives the supply voltage Vcc of the positive power supply 5 with the potential at the ground terminal T23 defined as a reference potential (0 V) (see FIG. 20). The output terminal T22 of the integrated circuit 300 is electrically connected to the first gate G1 via the resistor Rg. The signal input terminal T24 of the integrated circuit 300 receives a control signal from the control circuit 32.

The voltage application circuit 30 is controlled by the control circuit 32 to apply a test voltage Vx to the first gate G1 (see FIG. 20). When a control signal is supplied from the control circuit 32 to the signal input terminal T24, the integrated circuit 300 outputs a constant current (hereinafter referred to as a "test current Ix") from the output terminal T22. That is to say, the test voltage Vx is determined by the magnitude (i.e., current value) of the test current Ix supplied from the output terminal T22 of the integrated circuit 300 and the resistance value of the resistor Rg. Note that the test voltage Vx is preferably a voltage that is not lower than the forward voltage of a first diode structure (diode) formed by the first p-type layer 191 of the first gate G1, the second nitride semiconductor layer 105, and the n-channel layer (i.e., a voltage higher than the forward voltage). The test voltage Vx may fall within the range from 3 V to 4 V, for example.

(4.3) Control Circuit and Decision Circuit

The control circuit 32 includes a microcontroller as a major constituent element thereof. The decision circuit 31 shares the microcontroller in common with the control circuit 32. The decision circuit 31 may include, for example, a comparator built in the microcontroller as a major constituent element thereof. The decision circuit 31 makes, based on the voltage at the first gate G1 (gate voltage Vgx) with respect to the first source S1 when the test voltage Vx is applied to the first gate G1 of the bidirectional switch 1, a failure diagnosis on the bidirectional switch 1. Specifically, the decision circuit 31 determines, by comparing the gate voltage Vgx with a decision threshold voltage, whether or not the bidirectional switch 1 has caused any failure. Note that the gate voltage Vgx may be supplied to the decision circuit 31 either as it is (i.e., as an analog voltage) or after having been A/D converted from the analog voltage into a digital value by an A/D converter built in the microcontroller. In the following description, the gate voltage Vgx supplied to the decision circuit 31 is supposed to have a digital value.

(4.3) Operation of Decision Circuit

In the bidirectional switch 1 operating properly, when the first gate driver circuit 11 turns ON the first gate G1, the difference (potential difference) between the potential at the first gate G1 and the potential at the first source S1 becomes approximately equal to 0 V. At this time, when the test voltage Vx is applied from the voltage application circuit 30 of the diagnosis device 3A to the first gate G1, the potential at the first gate G1 becomes greater (i.e., higher) than the potential at the first source S1 but the first gate G1 is still ON. Also, if the bidirectional switch 1 is operating properly when the test voltage Vx is applied, the test current Ix flows through the first diode structure including the first p-type layer 191 of the first gate G1, the second nitride semiconductor layer 105, and the channel layer (see FIG. 20). Thus, the gate voltage Vgx supplied to the decision circuit 31 is a voltage approximately equal to the forward voltage when the test current Ix flows through the first diode structure including the first p-type layer 191 of the first gate G1 (in other words, a diode formed between the first gate G1 and the first source S1).

On the other hand, if the bidirectional switch 1 has caused a failure (e.g., if the first diode structure including the first p-type layer 191 of the first gate G1 has caused a short-circuit failure (in the case of a short-circuit failure)), then the gate voltage Vgx becomes approximately equal to 0 V. Meanwhile, if the pn junction of the first gate G1 has caused an open-circuit failure (in the case of an open-circuit failure)), then the gate voltage Vgx becomes indefinite.

Thus, the decision circuit 31 compares the gate voltage Vgx with a threshold value which is less (i.e., lower) than the forward voltage when the test current Ix flows through the first diode structure including the first p-type layer 191 of the first gate G1 and which is greater (i.e., higher) than 0 V. The decision circuit 31 preferably determines the bidirectional switch 1 to be operating properly when finding a period in which the gate voltage Vgx is equal to or greater than the threshold value (i.e., the number of digital values of the gate voltage Vgx that are equal to or greater than the threshold value) accounting for 90-95% or more of a predetermined diagnosis period (with a length of a few ten milliseconds to several hundred milliseconds, for example). On the other hand, the decision circuit 31 preferably decides that the bidirectional switch 1 should have caused a short-circuit failure when finding a period in which the gate voltage Vgx is less than the threshold value (i.e., the number of digital values of the gate voltage Vgx that are less than the threshold value) accounting for 90-95% or more of the diagnosis period. Furthermore, the decision circuit 31 preferably decides that the bidirectional switch 1 should have caused an open-circuit failure when finding a period in which the gate voltage Vgx is equal to or greater than the threshold value accounting for less than 90-95% of the diagnosis period and a period in which the gate voltage Vgx is less than the threshold value accounting for less than 90-95% of the diagnosis period. Note that the numerical value (such as 90-95%) used to determine whether or not the decision circuit 31 has caused any failure (either a short-circuit failure or an open-circuit failure) is only an example and should not be construed as limiting.

(4.4) Operation of Control Circuit

The control circuit 32 controls the first gate driver circuit 11, the voltage application circuit 30, and the decision circuit 31 on an individual basis. The control circuit 32 outputs a control signal CS1 to the signal input terminal T14 of the first gate driver circuit 11 (see FIG. 20). The control circuit 32 makes the first gate driver circuit 11 turn ON the first gate G1 by outputting the control signal CS1 (i.e., by asserting the control signal CS1 to H level) and also makes the first gate driver circuit 11 turn OFF the first gate G1 by outputting no control signals CS1 (i.e., by negating the control signal CS1 to L level) (see FIG. 21). Note that the control circuit 32 turns ON the first gate G1 by turning ON the switching element Q1 with the control signal CS1 asserted to H level and a control signal CS3 asserted to H level.

In addition, the control circuit 32 outputs a control signal CS2 to the signal input terminal T24 of the voltage application circuit 30 (see FIG. 20). The control circuit 32 makes the voltage application circuit 30 apply the test voltage Vx to the first gate G1 by outputting the control signal CS2 (i.e., by asserting the control signal CS2 to H level) and also makes the voltage application circuit 30 apply no test voltage Vx to the first gate G1 by outputting no control signal CS2 (i.e., by negating the control signal CS2 to L level) (see FIG. 21).

Furthermore, the control circuit 32 outputs the control signal CS3 to the gate of the switching element Q1 (see FIG. 20). The control circuit 32 turns ON the switching element Q1 by outputting the control signal CS3 (i.e., by asserting the control signal CS3 to H level) and turns OFF the switching element Q1 by outputting no control signal CS3 (i.e., by negating the control signal CS3 to L level) (see FIG. 21).

(4.5) Operation of Diagnosis Device

Figure 21:
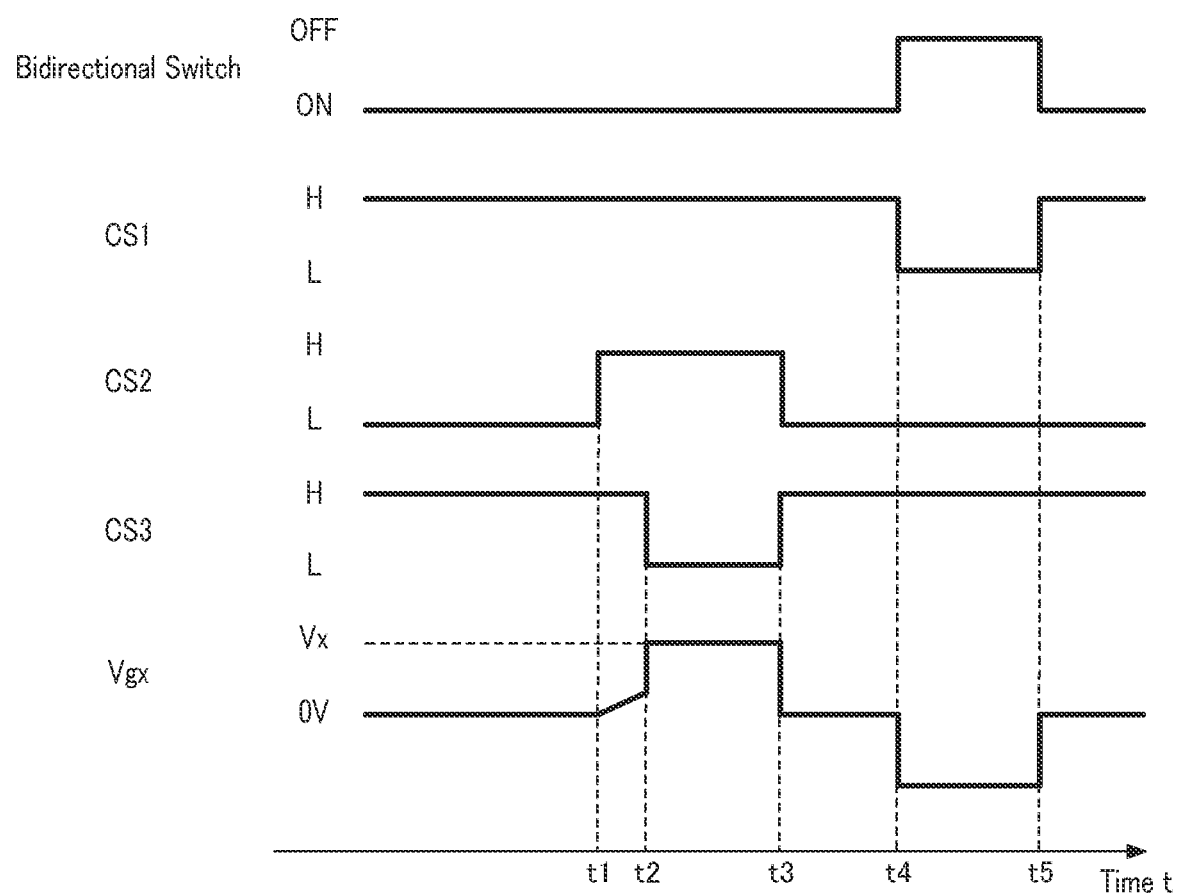
FIG. 21 is a timing chart showing how the switch system operates.

Next, it will be described in further detail with reference to the timing chart of FIG. 21 how the diagnosis device 3 (3A) operates. Note that the uppermost waveform shown in FIG. 21 indicates the state (either ON state or OFF state) of the bidirectional switch 1. As used herein, the "ON state of the bidirectional switch 1" means that the operation mode of the bidirectional switch 1 is in bidirectionally ON state and the "OFF state of the bidirectional switch 1" means that the operation mode of the bidirectional switch 1 is in bidirectionally OFF state. In the bidirectionally ON state, the resistance of the bidirectional switch 1 is smaller than the resistance of the bidirectional switch 1 in the bidirectionally OFF state and the voltage between the second source S2 and the first source S1 of the bidirectional switch 1 may be approximately equal to 0 V, for example. The second uppermost waveform shown in FIG. 21 indicates the waveform of the control signal CS1. The third uppermost waveform shown in FIG. 21 indicates the waveform of the control signal CS2. The fourth uppermost waveform shown in FIG. 21 indicates the waveform of the control signal CS3. The lowermost waveform shown in FIG. 21 indicates the waveform of the gate voltage Vgx.

Before a time t=t1, the control circuit 32 outputs the control signal CS1 with the switching element Q1 turned ON by outputting the control signal CS3. As a result, the potential difference (gate voltage Vgx) between the first gate G1 and the first source S1 of the bidirectional switch 1 is maintained by the first gate driver circuit 11 at approximately 0 V, thereby turning ON the bidirectional switch 1. In addition, the control circuit 32 controls the voltage application circuit 30 to the non-operating state (i.e., a state where the test voltage Vx is not applied from the voltage application circuit 30 to the first gate G1) by outputting no control signal CS2.

When the time t=t1 comes, the control circuit 32 controls the voltage application circuit 30 to the operating state (i.e., a state where the test voltage Vx is applied from the voltage application circuit 30 to the first gate G1) by outputting the control signal CS2 while continuously outputting the control signals CS1, CS3. At this point in time, the switching element Q1 is in ON state, and therefore, part of the test current Ix supplied from the voltage application circuit 30 flows through the first gate driver circuit 11 via the switching element Q1. As a result, the gate voltage Vgx gradually increases (i.e., rises) from 0 V.

When the time t=t2 comes, the control circuit 32 turns OFF the switching element Q1 by stopping outputting the control signal CS3 while continuously outputting the control signals CS1, CS2. When the switching element Q1 turns OFF, the part of the test current Ix supplied from the voltage application circuit 30 stops flowing through the first gate driver circuit 11. If the bidirectional switch 1 is operating properly, then the gate voltage Vgx rises steeply to the test voltage Vx right after the switching element Q1 has turned OFF. Then, the control circuit 32 activates the decision circuit 31 after having stopped outputting the control signal CS3.

When the time t=t3 comes, the control circuit 32 makes the voltage application circuit 30 stop supplying the test current Ix by stopping outputting the control signal CS2 while continuously outputting the control signal CS1. In addition, the control circuit 32 also outputs the control signal CS3 to turn ON the switching element Q1. Then, in the interval between the time t=t2 and the time t=t3 (i.e., in a diagnosis period), the control circuit 32 receives the results of the failure diagnosis made by the decision circuit 31, namely, whether or not any failure has been caused and the type of the failure (i.e., whether the failure is a short-circuit failure or an open-circuit failure) if any, from the decision circuit 31. Note that the control circuit 32 preferably displays, on a display device such as a liquid crystal display, the results of the failure diagnosis received from the decision circuit 31. Alternatively, the control circuit 32 may inform a system for controlling the operation of the load 9 of the results of the failure diagnosis.

If the bidirectional switch 1 is operating properly, the control circuit 32 stops outputting the control signal CS1 in accordance with the instruction given by a system for controlling the operation of the load 9 (hereinafter referred to as a "load control system"), thereby making the first gate driver circuit 11 turn OFF the first gate G1 (at a time t=t4). When the first gate G1 turns OFF, the bidirectional switch 1 also turns OFF, thereby interrupting the power feeding path 80 between the power supply 7 and the load 9. Also, if the bidirectional switch 1 is operating properly, the control circuit 32 resumes outputting the control signal CS1 in accordance with the instruction given by the load control system, thereby making the first gate driver circuit 11 turn ON the first gate G1 (at a time t=t5). When the first gate G1 turns ON, the bidirectional switch 1 also turns ON, thus stopping interrupting the power feeding path 80 between the power supply 7 and the load 9.

Also, the control circuit 32 preferably makes a failure diagnosis on the set including the first gate G1 and the first source S1 by activating one diagnosis device 3A and then makes a failure diagnosis on the set including the second gate G2 and the second source S2 by activating the other diagnosis device 3B. In addition, the control circuit 32 preferably makes such a failure diagnosis at regular intervals.

(5) Advantages of Diagnosis Device and Switch System (Interrupter)

As can be seen from the foregoing description, the diagnosis device 3 (3A, 3B) makes the voltage application circuit 30 apply the test voltage Vx to the gate (first gate G1, second gate G2) while the gate is not reverse biased with respect to the source (first source S1, second source S2). In addition, the diagnosis device 3 makes the decision circuit 31 make a failure diagnosis on the bidirectional switch 1 based on the voltage at the gate (gate voltage Vgx) with respect to the source when the test voltage Vx is applied. That is to say, the switch system 20h serving as the interrupter may make a failure diagnosis on the bidirectional switch 1 with the power continuously supplied from the power supply 7 to the load 9 by turning ON the bidirectional switch 1. Thus, there is no need for the switch system 20h including the bidirectional switch 1 to stop supplying power from the power supply 7 to the load 9 for the purpose of making a failure diagnosis on the bidirectional switch 1.

In addition, the diagnosis device 3 (3A) prevents the test current Ix from leaking toward the first gate driver circuit 11 by turning OFF the switching element Q1. This reduces the variation in the gate voltage Vgx to be provided to the decision circuit 31, thus contributing to shortening the time it takes to make a failure diagnosis and improving the accuracy of the failure diagnosis.

In the diagnosis device 3A, the decision circuit 31 included in the diagnosis device 3A may serve as a first decision unit for determining, based on the voltage at the first gate G1 and the first threshold voltage Vth1, the state of the first gate G1 in the first period T1 in which a signal to turn OFF the first gate G1 is output from the control unit to the first gate driver circuit 11. In the diagnosis device 3B, the decision circuit 31 included in the diagnosis device 3B may serve as a second decision unit for determining, based on the voltage at the second gate G2 and the second threshold voltage Vth2, the state of the second gate G2 in the second period T2 in which a signal to turn OFF the second gate G2 is output from the control unit to the second gate driver circuit 12.

Figure 22:
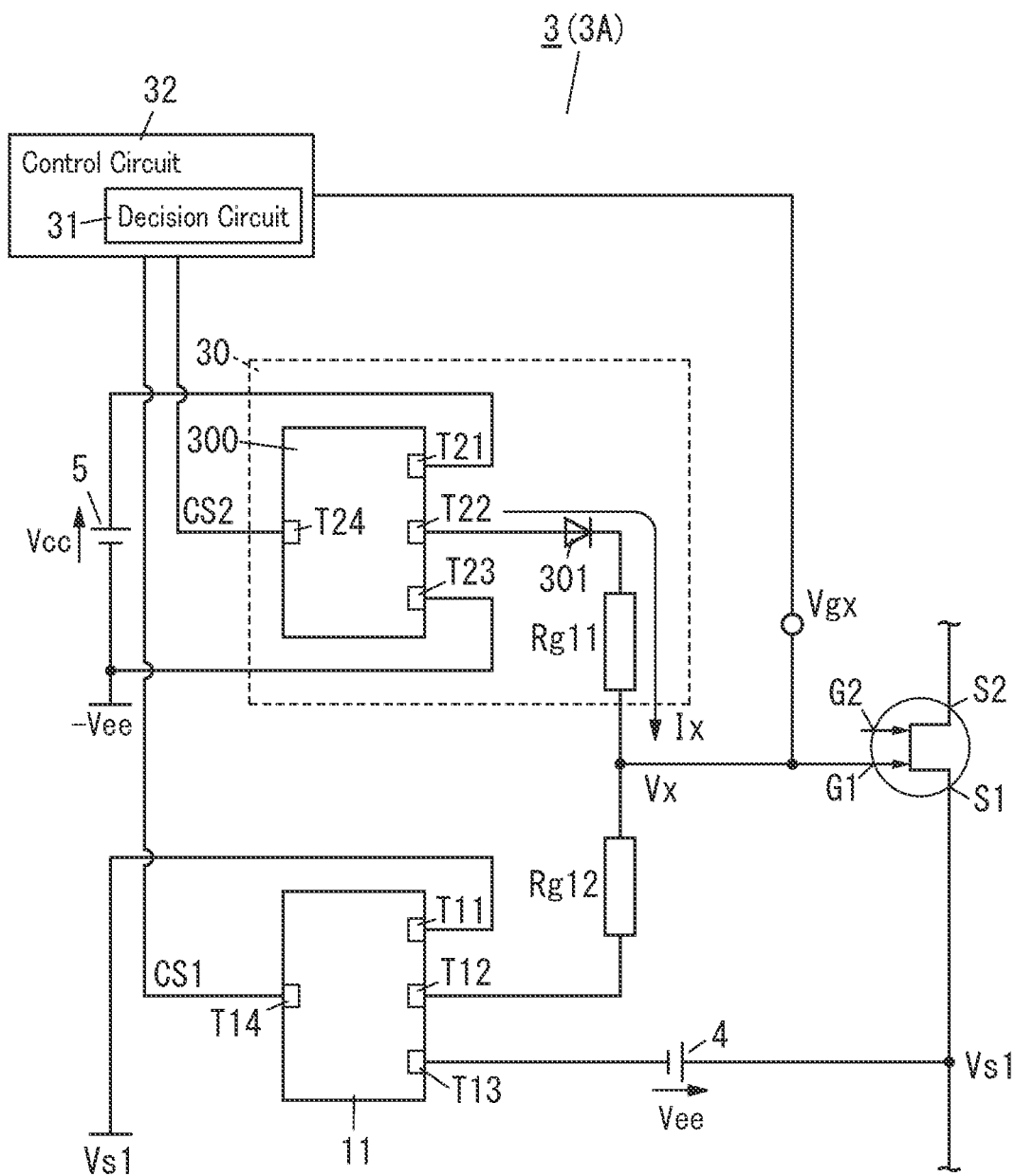
FIG. 22 illustrates a partially omitted circuit configuration for a switch system according to a variation of the ninth embodiment.

(6) Variation of Diagnosis Device (6.1) Differences Between the Embodiment and this Variation Next, a variation of the diagnosis device 3 of the switch system 20h according to the ninth embodiment will be described with reference to FIG. 22. In the diagnosis device 3 according to this variation, the ground terminal T23 of the integrated circuit 300 is connected, along with the ground terminal T13 of the first gate driver circuit 11, to the negative electrode of the negative power supply 4, which is a difference from the diagnosis device 3 of the switch system 20h according to the ninth embodiment. In addition, in the diagnosis device 3 according to this variation, a diode 301 is connected in the forward direction between the output terminal T22 of the integrated circuit 300 and a resistor (first resistor) Rg111, which is another difference from the diagnosis device 3 of the switch system 20h according to the ninth embodiment. Furthermore, in the diagnosis device 3 according to this variation, a second resistor Rg12 is inserted, instead of the switching element Q1, between the first resistor Rg11 and the output terminal T12 of the first gate driver circuit 11, which is still another difference from the diagnosis device 3 of the switch system 20h according to the ninth embodiment. Except these differences, the diagnosis device 3 according to this variation has the same configuration as the diagnosis device 3 of the switch system 20h according to the ninth embodiment. Thus, in the following description, any constituent element of this variation, having the same function as a counterpart of the diagnosis device 3 of the switch system 20h according to the ninth embodiment described above, will be designated by the same reference numeral as that counterpart's, and illustration and description thereof will be omitted herein as appropriate.

(6.2) Operation of Diagnosis Device According to this Variation

Figure 23:
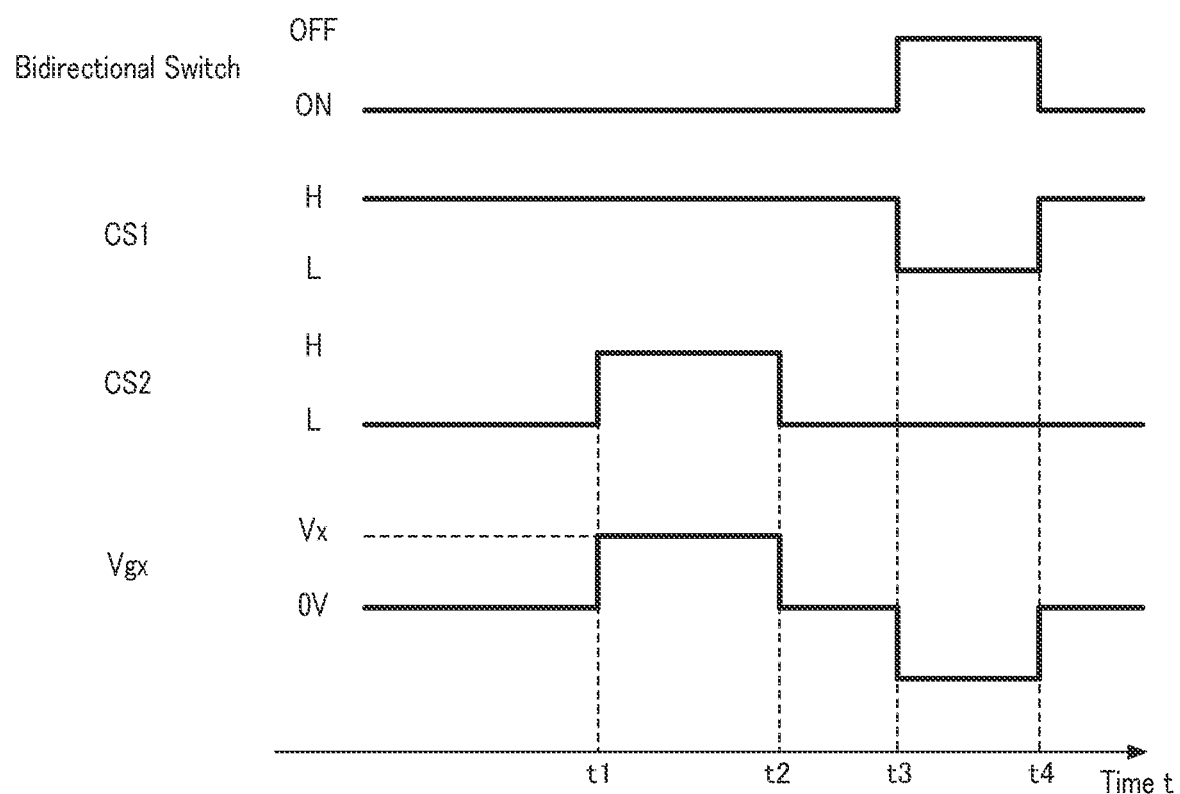
FIG. 23 is a timing chart showing how the switch system operates.

Next, it will be described in detail with reference to the timing chart of FIG. 23 how the diagnosis device 3 (3A) according to this variation operates. Note that the uppermost waveform shown in FIG. 23 indicates the state (either ON state or OFF state) of the bidirectional switch 1. The second uppermost waveform shown in FIG. 23 indicates the waveform of the control signal CS1. The third uppermost waveform shown in FIG. 23 indicates the waveform of the control signal CS2. The lowermost waveform shown in FIG. 23 indicates the waveform of the gate voltage Vgx.

Before a time t=t1, the control circuit 32 outputs the control signal CS1. As a result, the potential difference (gate voltage Vgx) between the first gate G1 and the first source S1 of the bidirectional switch 1 is maintained by the first gate driver circuit 11 at approximately 0 V, thereby turning ON the bidirectional switch 1. In addition, the control circuit 32 controls the voltage application circuit 30 to the non-operating state by outputting no control signal CS2.

When the time t=t1 comes, the control circuit 32 controls the voltage application circuit 30 to the operating state and activates the decision circuit 31 by outputting the control signal CS2 while continuously outputting the control signal CS1. At this point in time, part of the test current Ix supplied from the voltage application circuit 30 is going to flow toward the first gate driver circuit 11 but has its amount limited by the second resistor Rg12 inserted between the first resistor Rg11 and the first gate driver circuit 11. As a result, the gate voltage Vgx immediately rises from approximately 0 V to the test voltage Vx.

When the time t=t2 comes, the control circuit 32 makes the voltage application circuit 30 stop supplying the test current Ix by stopping outputting the control signal CS2 while continuously outputting the control signal CS1. In addition, in the interval between the time t=t1 and the time t=t2 (i.e., in a diagnosis period), the control circuit 32 receives the results of the failure diagnosis made by the decision circuit 31, from the decision circuit 31.

If the bidirectional switch 1 is operating properly, the control circuit 32 stops outputting the control signal CS1 in accordance with, for example, the instruction given by the load control system, thereby making the first gate driver circuit 11 turn OFF the first gate G1 (at a time t=3). When the first gate G1 turns OFF, the bidirectional switch 1 also turns OFF, thereby interrupting the power feeding path 80 between the power supply 7 and the load 9. Also, if the bidirectional switch 1 is operating properly, the control circuit 32 resumes outputting the control signal CS1 in accordance with, for example, the instruction given by the load control system, thereby making the first gate driver circuit 11 turn ON the first gate G1 (at a time t=4). When the first gate G1 turns ON, the bidirectional switch 1 also turns ON, thus stopping interrupting the power feeding path 80 between the power supply 7 and the load 9.

In this case, in the diagnosis device 3 according to this variation, if the first gate G1 is OFF, the potential at the output terminal T22 of the integrated circuit 300 becomes equal to the potential (−Vee) at the output terminal T12 of the first gate driver circuit 11. As a result, a leakage current could flow from the first gate G1 toward the voltage application circuit 30. Thus, in the diagnosis device 3 according to this variation, the diode 301 is inserted, in a direction in which its anode is connected to the output terminal T22 of the integrated circuit 300, between the output terminal T22 and the first resistor Rg11, thereby keeping the leakage current from flowing toward the voltage application circuit 30.

Note that the control circuit 32 preferably makes a failure diagnosis on the set including the first gate G1 and the first source S1 by activating one diagnosis device 3A and then makes a failure diagnosis on the set including the second gate G2 and the second source S2 by activating the other diagnosis device 3B. In addition, the control circuit 32 preferably makes such a failure diagnosis at regular intervals.

(6.3) Advantage of Diagnosis Device According to this Variation

The diagnosis device 3 according to this variation does not use the switching element Q1, thus contributing to, for example, simplifying the circuit configuration, compared to the diagnosis device 3 of the switch system 20h according to the ninth embodiment.

(7) Reference Example of Switch System (Interrupter) and Diagnosis Device

Figure 24:
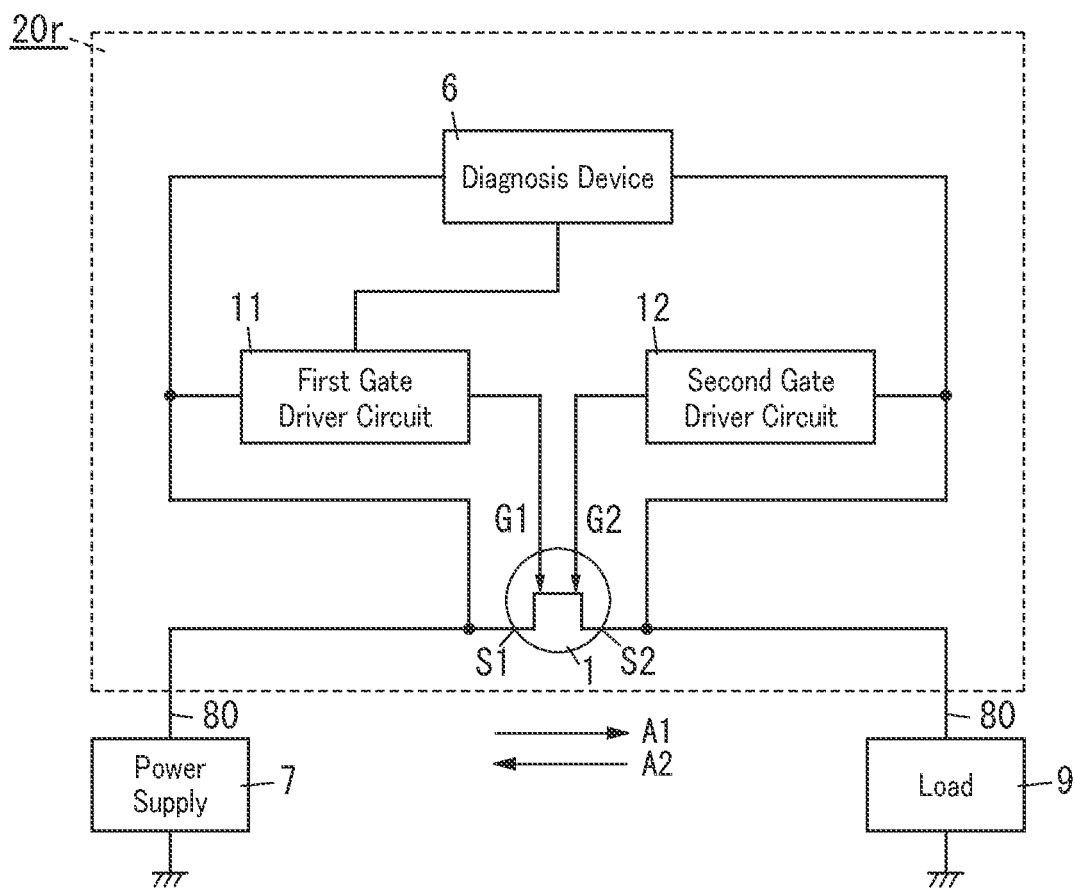
FIG. 24 is a block diagram of a switch system according to a reference example.

Next, a reference example of the switch system (interrupter) and diagnosis device will be described with reference to FIG. 24. A switch system 20r according to this reference example includes the bidirectional switch 1, the gate driver circuit (first gate driver circuit 11 and second gate driver circuit 12) for driving the bidirectional switch 1, and a diagnosis device 6 according to this reference example. The switch system 20r according to this reference example, as well as the switch system 20h according to the ninth embodiment, is configured to make the bidirectional switch 1 open and close the power feeding path 80 from the power supply 7 to the load 9. Note that the bidirectional switch 1, the power supply 7, and the load 9 are the same as the bidirectional switch 1, the power supply 7, and the load 9 according to the ninth embodiment, and therefore, description thereof will be omitted herein.

In this reference example, if the first diode structure between the gate and source with the higher potential (i.e., the first gate G1 and the first source S1) of the bidirectional switch 1 has caused a short-circuit failure, the potential at the first source S1 with respect to the potential at the second source S2 defined as a reference (i.e., the potential difference between the potential at the first source S1 and the potential at the second source S2) becomes approximately equal to 0 V. On the other hand, if the first diode structure between the first gate G1 and the first source S1 of the bidirectional switch 1 is operating properly, then the potential difference between the potential at the second source S2 and the potential at the first source S1 will have a value corresponding to the forward voltage of the first diode structure between the first gate G1 and the first source S1.

Thus, the diagnosis device 6 according to this reference example compares the potential difference between the potential at the second source S2 and the potential at the first source S1 with a threshold value with the first gate G1 of the bidirectional switch 1 turned OFF by controlling the first gate driver circuit 11. Then, when finding the potential difference between the potential at the second source S2 and the potential at the first source S1 equal to or greater than the threshold value, the diagnosis device 6 according to this reference example decides that the bidirectional switch 1 should be operating properly. On the other hand, when finding the potential difference between the potential at the second source S2 and the potential at the first source S1 less than the threshold value, the diagnosis device 6 according to this reference example decides that the (first gate G1 of the) bidirectional switch 1 should have caused a short-circuit failure.

As can be seen from the foregoing description, the diagnosis device 6 according to this reference example may make a failure diagnosis on the bidirectional switch 1 more accurately by making a diagnosis directly on the diode structure (i.e., the first diode structure) between the gate and source with the higher potential (i.e., the first gate G1 and the first source S1) of the bidirectional switch 1.

(Variations)

Note that the first to ninth embodiments described above are only exemplary ones of various embodiments of the present disclosure and should not be construed as limiting. Rather, the first to ninth embodiments may be readily modified in various manners depending on a design choice or any other factor without departing from the scope of the present disclosure. For example, two or more constituent elements according to mutually different embodiments may be adopted in combination as appropriate.

For example, the bidirectional switch 1 may have, on the surface 115 of the second nitride semiconductor layer 105, a recess structure right under each of the first gate G1 and the second gate G2.

Also, each of the first p-type layer 191 and the second p-type layer 192 of the bidirectional switch 1 does not have to be the p-type AlGaN layer but may also be a p-type GaN layer. Alternatively, each of the first p-type layer 191 and the second p-type layer 192 may also be a p-type metal-oxide semiconductor layer, for example. The p-type metal-oxide semiconductor layer may be an NiO layer, for example. The NiO layer may contain, as an impurity, at least one alkali metal selected from the group consisting of lithium (Li), sodium (Na), potassium (K), rubidium (Rb), and cesium (Cs). The NiO layer may also contain, for example, a transition metal such as silver (Ag) or copper (Cu) which becomes univalent when added as an impurity.

Optionally, the bidirectional switch 1 may each include one or more nitride semiconductor layers between the buffer layer 103 and the first nitride semiconductor layer 104. Also, the buffer layer 103 does not have to have a single-layer structure but may also have a superlattice structure, for example.

Furthermore, the substrate 102 of the bidirectional switch 1 does not have to be a silicon substrate but may also be a GaN substrate, an SiC substrate, or a sapphire substrate, for example.

Furthermore, the bidirectional switch 1 does not have to be the dual-gate-type bidirectional switch but may also be, for example, a common-drain-type bidirectional switch in which the respective drains of two FETs are connected together.

(Aspects)

The first to ninth embodiments and their variations described above may be specific implementations of the following aspects of the present disclosure.

A switch system (20; 20a; 20b; 20h) according to a first aspect includes a bidirectional switch (1), a first gate driver circuit (11; 11a), a second gate driver circuit (12; 12a), a control unit (13; 13a), a first decision unit (21), and a second decision unit (22). The bidirectional switch (1) includes: a first source (S1); a second source (S2); a first gate (G1) provided closer to the first source (S1) between the first source (S1) and the second source (S2) and corresponding to the first source (S1); and a second gate (G2) provided closer to the second source (S2) between the first source (S1) and the second source (S2) and corresponding to the second source (S2). The first gate driver circuit (11; 11a) is connected to the first gate (G1). The second gate driver circuit (12; 12a) is connected to the second gate (G2). The control unit (13; 13a) controls the first gate driver circuit (11; 11a) and the second gate driver circuit (12; 12a). The first decision unit (21) determines, based on a voltage at the first gate (G1) and a first threshold voltage (Vth1), a state of the first gate (G1) in a first period (T1) in which a signal to turn OFF the first gate (G1) is output from the control unit (13; 13a) to the first gate driver circuit (11; 11a). The second decision unit (22) determines, based on a voltage at the second gate (G2) and a second threshold voltage (Vth2), a state of the second gate (G2) in a second period (T2) in which a signal to turn OFF the second gate (G2) is output from the control unit (13; 13a) to the second gate driver circuit (12; 12a).

The switch system (20; 20a; 20b; 20h) according to the first aspect may sense the state of the bidirectional switch (1).

In a switch system (20a; 20b) according to a second aspect, which may be implemented in conjunction with the first aspect, the bidirectional switch (1) is a normally-off JFET, of which the first gate (G1) includes a first p-type layer (191) and a first gate electrode (181) and of which the second gate (G2) includes a second p-type layer (192) and a second gate electrode (182). The first gate driver circuit (11a) includes a first gate resistor (R1), a first switch (SW1), and a second gate resistor (R2). The first gate resistor (R1) is connected to the first gate (G1). The first switch (SW1) is connected to the first gate resistor (R1) in series and controlled by the control unit (13a). The second gate resistor (R2) has a larger resistance value than the first gate resistor (R1). The second gate resistor (R2) is connected in parallel to a series circuit of the first gate resistor (R1) and the first switch (SW1). The second gate driver circuit (12a) includes a third gate resistor (R3), a second switch (SW2), and a fourth gate resistor (R4). The third gate resistor (R3) is connected to the second gate (G2). The second switch (SW2) is connected to the third gate resistor (R3) in series and controlled by the control unit (13a). The fourth gate resistor (R4) has a larger resistance value than the third gate resistor (R3). The fourth gate resistor (R4) is connected in parallel to a series circuit of the third gate resistor (R3) and the second switch (SW2).

In a switch system (20a; 20b) according to a third aspect, which may be implemented in conjunction with the second aspect, the first decision unit (21) determines the first gate (G1) to be abnormal when finding the voltage at the first gate (G1) lower than the first threshold voltage (Vth1) while a signal to turn ON the first gate (G1) and a signal to turn ON the first switch (SW1) are output from the control unit (13a). The first decision unit (21) also determines the first gate (G1) to be abnormal when finding the voltage at the first gate (G1) higher than the first threshold voltage (Vth1) while the signal to turn ON the first gate (G1) and a signal to turn OFF the first switch (SW1) are output from the control unit (13). The second decision unit (22) determines the second gate (G2) to be abnormal when finding the voltage at the second gate (G2) lower than the second threshold voltage (Vth2) while a signal to turn ON the second gate (G2) and a signal to turn ON the second switch (SW2) are output from the control unit (13a). The second decision unit (22) also determines the second gate (G2) to be abnormal when finding the voltage at the second gate (G2) higher than the second threshold voltage (Vth2) while the signal to turn ON the second gate (G2) and a signal to turn OFF the second switch (SW2) are output from the control unit (13).

The switch system (20a; 20b) according to the third aspect allows the control unit (13a) to sense the occurrence of the abnormality that the first gate (G1) cannot turn from OFF to ON and the abnormality that the second gate (G2) cannot turn from OFF to ON.

Ina switch system (20; 20a; 20b) according to a fourth aspect, which may be implemented in conjunction with any one of the first to third aspects, the first period (T1) and the second period (T2) at least partially overlap with each other.

The switch system (20; 20a; 20b) according to the fourth aspect may shorten the time it takes to sense the state of the bidirectional switch (1), compared to a situation where the first period (T1) and the second period (T2) do not at least partially overlap with each other.

In a switch system (20; 20a; 20b) according to a fifth aspect, which may be implemented in conjunction with any one of the first to third aspects, the first period (T1) and the second period (T2) are defined at mutually different timings.

A switch system (20b) according to a sixth aspect, which may be implemented in conjunction with any one of the first to fifth aspects, includes: a plurality of the bidirectional switches (1); a plurality of the first decision units (21); and a plurality of the second decision units (22). In the switch system (20b), the plurality of the bidirectional switches (1) are connected in parallel with each other. The plurality of the first decision units (21) and the plurality of the second decision units (22) correspond one to one to the plurality of the bidirectional switches (1). The switch system (20b) regards at least one of the plurality of the bidirectional switches (1) as a non-target bidirectional switch (1) and makes the first decision unit (21) and the second decision unit (22) respectively determine states of the first gate (G1) and the second gate (G2) of a target bidirectional switch (1) out of the plurality of the bidirectional switches (1) while a current is allowed to flow between the first source (S1) and the second source (S2) of the non-target bidirectional switch (1).

The switch system (20b) according to the sixth aspect may regard at least one of the plurality of bidirectional switches (1) as a non-target bidirectional switch (1) and make the first decision unit (21) and the second decision unit (22) respectively determine states of the first gate (G1) and the second gate (G2) of a target bidirectional switch (1) while a current is allowed to flow between the first source (S1) and the second source (S2) of the non-target bidirectional switch (1).

In a switch system (20b) according to a seventh aspect, which may be implemented in conjunction with the sixth aspect, the switch system (20b) regards only one bidirectional switch (1) as the target bidirectional switch (1) out of the plurality of the bidirectional switches (1) and regards all of the plurality of the bidirectional switches (1) but the target bidirectional switch (1) as the non-target bidirectional switches (1).

The switch system (20b) according to the seventh aspect may extend the life of each of the plurality of bidirectional switches (1).

A switch system (20c) according to an eighth aspect includes a bidirectional switch (1), a first gate driver circuit (11), a second gate driver circuit (12), a control unit (13), and a sensing unit (14). The bidirectional switch (1) includes; a first source (S1); a second source (S2); a first gate (G1) provided closer to the first source (S1) between the first source (S1) and the second source (S2) and corresponding to the first source (S1); and a second gate (G2) provided closer to the second source (S2) between the first source (S1) and the second source (S2) and corresponding to the second source (S2). The first gate driver circuit (11) is connected to the first gate (G1). The second gate driver circuit (12) is connected to the second gate (G2). The control unit (13) controls the first gate driver circuit (11) and the second gate driver circuit (12). The sensing unit (14) is connected to the bidirectional switch (1). The switch system (20c) includes multiple sets, each of which includes the bidirectional switch (1), the first gate driver circuit (11), the second gate driver circuit (12), the control unit (13), and the sensing unit (14). In the switch system (20c), a plurality of the bidirectional switches (1) are connected in parallel with each other. Each of a plurality of the sensing units (14) senses, when at least one of the plurality of the bidirectional switches (1), other than the bidirectional switch (1) included in the same set as the sensing unit (14), is electrically conductive, the state of the bidirectional switch (1) included in the same set as the sensing unit (14) in each of a first state and a second state of the control unit (13) included in the same set as the sensing unit (14). The first state is a state where the control unit (13) included in the same set as the sensing unit (14) outputs a signal to turn OFF the first gate (G1) of the bidirectional switch (1) included in the same set as the sensing unit (14) and outputs a signal to turn ON the second gate (G2) thereof. The second state is a state where the control unit (13) included in the same set as the sensing unit (14) outputs a signal to turn OFF the second gate (G2) of the bidirectional switch (1) included in the same set as the sensing unit (14) and outputs a signal to turn ON the first gate (G1) thereof.

The switch system (20c) according to the eighth aspect may sense the state of the bidirectional switch (1).

In a switch system (20c) according to a ninth aspect, which may be implemented in conjunction with the eighth aspect, each of a plurality of the control units (13) has, in the first state, a state-sensing first OFF-state voltage applied to the first gate (G1) of the bidirectional switch (1) included in the same set as the control unit (13) and has, in the second state, a state-sensing second OFF-state voltage applied to the second gate (G2) of the bidirectional switch (1) included in the same set as the control unit (13). Note that the difference between the first threshold voltage (Vth1) and the first OFF-state voltage is greater than the voltage difference of the bidirectional switch (1). The difference between the second threshold voltage (Vth2) and the second OFF-state voltage is greater than the voltage difference of the bidirectional switch (1).

In a switch system (20c) according to a tenth aspect, which may be implemented in conjunction with the ninth aspect, each of the plurality of the sensing units (14) includes a decision unit (15) to determine, based on a current flowing between the first source (S1) and the second source (S2) of the bidirectional switch (1) included in the same set as the sensing unit (14) and a predetermined value, the state of the bidirectional switch (1) included in the same set as the sensing unit (14).

The switch system (20c) according to the tenth aspect allows each of the plurality of the sensing units (14) to determine the state of the bidirectional switch (1) based on the current flowing between the first source (S1) and the second source (S2) of the bidirectional switch (1) and a predetermined value.

In a switch system (20c) according to an eleventh aspect, which may be implemented in conjunction with the ninth aspect, each of the plurality of the sensing units (14) includes a decision unit (15). In a state where the control unit (13) included in the same set as each of a plurality of the decision units (15) outputs a signal to turn ON the first gate (G1) of the bidirectional switch (1) included in the same set as the decision unit (15) and a signal to turn ON the second gate (G2) thereof, the decision unit (15) determines, based on a current flowing between the first source (S1) and the second source (S2) of the bidirectional switch (1) included in the same set as the decision unit (15) and a first predetermined value, whether or not the bidirectional switch (1) included in the same set as the decision unit (15) is operating properly. In each of a state where the control unit (13) included in the same set as the decision unit (15) outputs a signal to turn OFF the first gate (G1) of the bidirectional switch (1) included in the same set as the decision unit (15) and a signal to turn ON the second gate (G2) thereof and a state where the control unit (13) included in the same set as the decision unit (15) outputs a signal to turn OFF the second gate (G2) of the bidirectional switch (1) included in the same set as the decision unit (15) and a signal to turn ON the first gate (G1) thereof, the decision unit (15) determines, based on the current flowing between the first source (S1) and the second source (S2) of the bidirectional switch (1) included in the same set as the decision unit (15) and a second predetermined value, whether or not the bidirectional switch (1) included in the same set as the decision unit (15) is operating properly.

In a switch system (20c) according to a twelfth aspect, which may be implemented in conjunction with the tenth aspect, each of the plurality of the sensing units (14) includes a resistor (16) connected in series to the bidirectional switch (1) included in the same set as the sensing unit (14).

The switch system (20c) according to the twelfth aspect may detect a current flowing through the bidirectional switch (1) based on the voltage across the resistor (16).

In a switch system (20c) according to a thirteenth aspect, which may be implemented in conjunction with the twelfth aspect, each of the plurality of the decision units (15) includes: a converter circuit (151) to convert a voltage across a resistor (16) included in the decision unit (15) into an absolute value; and a comparator circuit (152) to compare the absolute value with a predetermined threshold voltage.

The switch system (20c) according to the thirteenth aspect may determine, irrespective of the direction of the current flowing through the bidirectional switch (1), whether or not the amount of the current flowing through the bidirectional switch (1) is less than a predetermined value.

In a switch system (20c) according to a fourteenth aspect, which may be implemented in conjunction with the twelfth aspect, each of a plurality of the resistors (16) has: a first terminal (16A) connected to the bidirectional switch (1) included in the same set as the resistor (16); and a second terminal (16B) provided opposite from the first terminal (16A). Each of the plurality of the decision units (15) includes: a first comparator circuit (17A) to compare, by reference to a potential at the second terminal (16B) of the resistor (16), a potential at the first terminal (16A) with the potential at the second terminal (16B); and a second comparator circuit (17B) to compare, by reference to the potential at the first terminal (16A) of the resistor (16), the potential at the second terminal (16B) with the potential at the first terminal (16A).

The switch system (20c) according to the fourteenth aspect may determine, irrespective of the direction of the current flowing through the bidirectional switch (1), whether or not the current is flowing.

In a switch system (20d) according to a fifteenth aspect, which may be implemented in conjunction with the twelfth aspect, the resistor (16) of each of the plurality of the sensing units (14) includes: a first resistor (161) connected to the first source (S1) of the bidirectional switch (1) included in the same set as the sensing unit (14); and a second resistor (162) connected to the second source (S2) of the bidirectional switch (1) included in the same set as the sensing unit (14). Each of the plurality of the sensing units (14) includes: a first decision circuit (18A) to determine the bidirectional switch (1) to be operating improperly when finding a voltage across the first resistor (161) higher than a first reference voltage while the control unit (13) included in the same set as the sensing unit (14) is in the first state; and a second decision circuit (18B) to determine the bidirectional switch (1) to be operating improperly when finding a voltage across the second resistor (162) higher than a second reference voltage while the control unit (13) included in the same set as the sensing unit (14) is in the second state.

The switch system (20d) according to the fifteenth aspect allows, while the control unit (13) outputs a signal to turn OFF the first gate (G1) of the bidirectional switch (1) and a signal to turn ON the second gate (G2) thereof, the first decision circuit (18A) to determine whether or not a current has flowed in a direction from the second source (S2) toward the first source (S1) of the bidirectional switch (1). In addition, the switch system (20d) according to the fifteenth aspect also allows, while the control unit (13) outputs a signal to turn OFF the second gate (G2) of the bidirectional switch (1) and a signal to turn ON the first gate (G1) thereof, the second decision circuit (18B) to determine whether or not a current has flowed in a direction from the first source (S1) toward the second source (S2) of the bidirectional switch (1).

In a switch system (20f) according to a sixteenth aspect, which may be implemented in conjunction with the ninth aspect, each of the plurality of the sensing units (14) includes a temperature detection unit (19) to detect a temperature of the bidirectional switch (1) included in the same set as the sensing unit (14). Each of the plurality of the sensing units (14) determines, when finding the temperature detected by the temperature detection unit (19) higher than a threshold temperature while the control unit (13) included in the same set as the sensing unit (14) is in the first state, the bidirectional switch (1) included in the same set as the sensing unit (14) to be operating improperly. Each of the plurality of the sensing units (14) also determines, when finding the temperature detected by the temperature detection unit (19) higher than the threshold temperature while the control unit (13) included in the same set as the sensing unit (14) is in the second state, the bidirectional switch (1) included in the same set as the sensing unit (14) to be operating improperly.

The switch system (20f) according to the sixteenth aspect may determine, based on a variation in the temperature of the bidirectional switch (1), whether or not there is any abnormality about the current flowing through the bidirectional switch (1).

In a switch system (20g) according to a seventeenth aspect, which may be implemented in conjunction with the ninth aspect, each of the plurality of the bidirectional switches (1) is a normally-off JFET, of which the first gate (G1) includes a first p-type layer (191) and a first gate electrode (181) and of which the second gate (G2) includes a second p-type layer (192) and a second gate electrode (182). Each of the plurality of the sensing units (14) includes a first sensing unit (14A) and a second sensing unit (14B). In a state where control unit (13) included in the same set as the sensing unit (14) outputs a signal to turn OFF the second gate (G2) of the bidirectional switch (1) included in the same set as the sensing unit (14) and outputs a signal to turn ON the first gate (G1) thereof, the first sensing unit (14A) senses, based on a voltage at the first gate (G1), a power distribution state between the first source (S1) and the second source (S2) of the bidirectional switch (1) included in the same set as the sensing unit (14). In a state where control unit (13) included in the same set as the sensing unit (14) outputs a signal to turn OFF the first gate (G1) of the bidirectional switch (1) included in the same set as the sensing unit (14) and outputs a signal to turn ON the second gate (G2) thereof, the second sensing unit (14B) senses, based on a voltage at the second gate (G2), the power distribution state between the first source (S1) and the second source (S2) of the bidirectional switch (1) included in the same set as the sensing unit (14).

In a switch system (20g) according to an eighteenth aspect, which may be implemented in conjunction with the seventeenth aspect, each of a plurality of the first gate driver circuits (11) includes a first gate resistor (Rg1) connected to the first gate (G1) of the bidirectional switch (1) included in the same set as the first gate driver circuit (11). Each of a plurality of the second gate driver circuits (12) includes a second gate resistor (Rg2) connected to the second gate (G2) of the bidirectional switch (1) included in the same set as the second gate driver circuit (12). Each of a plurality of the first sensing units (14A) determines, when finding a voltage across the first gate resistor (Rg1) connected to the bidirectional switch (1) included in the same set as the first sensing unit (14) higher than a first predetermined voltage, the bidirectional switch (1) included in the same set as the first sensing unit (14) to be operating improperly. Each of a plurality of the second sensing units (14B) determines, when finding a voltage across the second gate resistor (R2) connected to the bidirectional switch (1) included in the same set as the second sensing unit (14B) higher than a second predetermined voltage, the bidirectional switch (1) included in the same set as the second sensing unit (14B) to be operating improperly.

In a switch system (20b; 20c; 20d; 20e; 20f; 20g) according to a nineteenth aspect, which may be implemented in conjunction with any one of the eighth to eighteenth aspects, each of a plurality of the control units (13) sets, at mutually different timings, a period in which the first gate driver circuit (11) included in the same set as the control unit (13) outputs a signal to turn OFF the first gate (G1) of the bidirectional switch (1) included in the same set as the control unit (13) and a period in which the second gate driver circuit (12) included in the same set as the control unit (13) outputs a signal to turn OFF the second gate (G2) of the bidirectional switch (1) included in the same set as the control unit (13).

A switch system (20b; 20c; 20d; 20e; 20f; 20g) according to a twentieth aspect, which may be implemented in conjunction with any one of the eighth to eighteenth aspects, further includes a controller (8) to control a plurality of the control units (13). The controller (8) controls the plurality of the control units (13) such that each of the plurality of the sensing units (14) senses the state of the bidirectional switch (1) included in the same set as the sensing unit (14). The plurality of the sensing units (14) sense respective states of the bidirectional switches (1) at mutually different timings.

Also, the ninth embodiment and its variations may be specific implementations of the following aspects of the present disclosure.

A diagnosis device (3) according to a twenty-first aspect of the present disclosure makes a failure diagnosis on a semiconductor switch (bidirectional switch 1). The semiconductor switch (bidirectional switch 1) includes at least a gate (first gate G1; second gate G2) and a source (first source S1; second source S2). The semiconductor switch is a normally closed type that allows no current to flow through the source when the gate is reverse biased with respect to the source and allows a current to flow through the source when the gate is not reverse biased with respect to the source. The diagnosis device (3) according to the twenty-first aspect includes a voltage application circuit (30) to apply a test voltage (Vx) for diagnosis to the gate in a state where the gate is not reverse biased with respect to the source. The diagnosis device (3) according to the twenty-first aspect includes a decision circuit (31) to make a failure diagnosis on the semiconductor switch (bidirectional switch 1) based on the voltage at the gate (gate voltage Vgx) with respect to the source w % ben the test voltage (Vx) is applied to the gate.

In the diagnosis device (3) according to the twenty-first aspect, even if the test voltage (Vx) is applied from the voltage application circuit (30) to the gate, the gate is not reverse biased. This allows the diagnosis device (3) to make a failure diagnosis on the semiconductor switch (bidirectional switch 1) with power continuously supplied from a power supply (7) to a load (9).

A diagnosis device (3) according to a twenty-second aspect of the present disclosure may be implemented in conjunction with the twenty-first aspect. In the diagnosis device (3) according to the twenty-second aspect, the test voltage (Vx) is preferably a voltage that is not lower than a forward voltage of a diode (pin diode structure) formed between the gate and source of the semiconductor switch (bidirectional switch 1).

The diagnosis device (3) according to the twenty-second aspect may make a failure diagnosis on the semiconductor switch (bidirectional switch 1) more accurately by using the forward voltage of the diode formed between the gate and the source as a criterion of decision.

A diagnosis device (3) according to a twenty-third aspect of the present disclosure may be implemented in conjunction with the twenty-first or twenty-second aspect. In the diagnosis device (3) according to the twenty-third aspect, a decision circuit (31) preferably determines whether or not the semiconductor switch (bidirectional switch 1) has caused any failure and the type of the failure if any.

The diagnosis device (3) according to the twenty-third aspect determines not only whether or not there is any failure but also the type of the failure (such as short-circuit failure or an open-circuit failure) if any, thereby facilitating dealing with any failure of the semiconductor switch (bidirectional switch 1).

A diagnosis device (3) according to a twenty-fourth aspect of the present disclosure may be implemented in conjunction with any one of the twenty-first to twenty-third aspects. In the diagnosis device (3) according to the twenty-fourth aspect, the decision circuit (31) preferably opens an electrical path for applying a reverse-biasing drive voltage to the gate after a predetermined standby time (time t=t1−t2) has passed since a point in time when the voltage application circuit (30) started to apply the test voltage (Vx) and preferably makes a failure diagnosis on the semiconductor switch (bidirectional switch 1) while the electrical path is opened.

The diagnosis device (3) according to the twenty-fourth aspect may prevent a leakage current from flowing through the electrical path for applying the reverse-biasing drive voltage to the gate while the test voltage (Vx) is being applied.

A diagnosis device (3) according to a twenty-fifth aspect of the present disclosure may be implemented in conjunction with the twenty-fourth aspect. The diagnosis device (3) according to the twenty-fifth aspect preferably includes a switching element (Q1) to open and close an electrical path for applying a drive voltage to the gate. The decision circuit (31) preferably opens the electrical path by controlling the switching element (Q1).

The diagnosis device (3) according to the twenty-fifth aspect may open the electrical path in a short time with reliability.

A diagnosis device (3) according to a twenty-sixth aspect of the present disclosure may be implemented in conjunction with any one of the twenty-first to twenty-third aspects. In the diagnosis device (3) according to the twenty-sixth aspect, the voltage application circuit (30) preferably applies the test voltage (Vx) to the gate via a rectifier element (diode 301).

The diagnosis device (3) according to the twenty-sixth aspect may prevent a leakage current from flowing from the gate to the voltage application circuit (30).

A diagnosis device (3) according to a twenty-seventh aspect of the present disclosure may be implemented in conjunction with the twenty-sixth aspect. The diagnosis device (3) according to the twenty-seventh aspect preferably includes, a first resistor (Rg11) electrically connected between the rectifier element and the gate; and a second resistor (Rg12) electrically connected to the first resistor (Rg11) in series. The second resistor (Rg12) is preferably inserted into an electrical path for applying a reverse-biasing drive voltage to the gate.

The diagnosis device (3) according to the twenty-seventh aspect contributes to simplifying the circuit configuration, compared to a situation where the switching element (Q1) opens the electrical path.

An interrupter (switch system 20h) according to a twenty-eighth aspect of the present disclosure includes a semiconductor switch (bidirectional switch 1) to open and close a power feeding path (80) from a power supply (7) to a load (9) and the diagnosis device (3) according to any one of the twenty-first to twenty-seventh aspects.

The interrupter (switch system 20h) according to the twenty-eighth aspect may make a failure diagnosis on the semiconductor switch (bidirectional switch 1) with power continuously supplied from the power supply (7) to the load (9).

An interrupter (switch system 20h) according to a twenty-ninth aspect of the present disclosure may be implemented in conjunction with the twenty-eighth aspect. In the interrupter (switch system 20h) according to the twenty-ninth aspect, the semiconductor switch (bidirectional switch 1) is preferably able to interrupt a current in a first direction (A1) from the power supply (7) toward the load (9) and a second direction (A2) from the load (9) toward the power supply (7).

The interrupter (switch system 20h) according to the twenty-ninth aspect may interrupt a current bidirectionally between the power supply (7) and the load (9).

An interrupter (switch system 20h) according to a thirtieth aspect of the present disclosure may be implemented in conjunction with the twenty-ninth aspect. In the interrupter (switch system 20h) according to the thirtieth aspect, the semiconductor switch (bidirectional switch 1) is preferably a dual-gate type including two gate-source pairs.

The interrupter (switch system 20h) according to the thirtieth aspect contributes to simplifying the circuit configuration while allowing the current to be interrupted bidirectionally between the power supply (7) and the load (9), compared to a situation where two semiconductor switches are provided independently in the direction from the power supply (7) toward the load (9) and in the direction from the load (9) toward the power supply (7), respectively.

An interrupter (switch system 20h) according to a thirty-first aspect of the present disclosure may be implemented in conjunction with any one of the twenty-eighth to thirtieth aspects. In the interrupter (switch system 20h) according to the thirty-first aspect, the voltage supplied from the power supply (7) to the load (9) via the semiconductor switch (bidirectional switch 1) is preferably a DC voltage.

The interrupter (switch system 20h) according to the thirty-first aspect may interrupt, by using the semiconductor switch (bidirectional switch 1), the electrical path from the power supply (7) to the load (9) without generating an arc.

A diagnosis method according to a thirty-second aspect of the present disclosure is a method for making a failure diagnosis on a semiconductor switch (bidirectional switch 1). The semiconductor switch (bidirectional switch 1) includes at least a gate and a source. The semiconductor switch is a normally closed type that allows no current to flow through the source when the gate is reverse biased with respect to the source and allows a current to flow through the source when the gate is not reverse biased with respect to the source. The diagnosis method according to the thirty-second aspect includes a procedure for applying a test voltage (Vx) for diagnosis to the gate when the gate is not reverse biased with respect to the source. The diagnosis method according to the thirty-second aspect includes a procedure for making a failure diagnosis on the semiconductor switch (bidirectional switch 1) based on the voltage at the gate with respect to the source when the test voltage (Vx) is applied to the gate.

The diagnosis method according to the thirty-second aspect enables making a failure diagnosis on the semiconductor switch (bidirectional switch 1) with power continuously supplied from a power supply (7) to a load (9).

REFERENCE SIGNS LIST

1 Bidirectional Switch
G1 First Gate
S1 First Source
G2 Second Gate
S2 Second Source
8 Controller
11 First Gate Driver Circuit
12 Second Gate Driver Circuit
13 Control Unit
14 Sensing Unit
15 Decision Unit
16 Resistor
16A First Terminal
16B Second Terminal
17A First Comparator Circuit
17B Second Comparator Circuit
18A First Decision Circuit
18B Second Decision Circuit
19 Temperature Detection Unit
20, 20a; 20b; 20c; 20d; 20e; 20f; 20g Switch System
191 First p-type Layer
192 Second p-type Layer
171 First Source Electrode
172 Second Source Electrode
181 First Gate Electrode
182 Second Gate Electrode
R1 First Gate Resistor
R2 Second Gate Resistor
R3 Third Gate Resistor
R4 Fourth Gate Resistor
SW1 First Switch
SW2 Second Switch
T1 First Period
T2 Second Period
Vth1 First Threshold Voltage
Vth2 Second Threshold Voltage

The invention claimed is:

1. A switch system comprising:
a bidirectional switch including: a first source; a second source; a first gate provided closer to the first source between the first source and the second source and corresponding to the first source; and a second gate provided closer to the second source between the first source and the second source and corresponding to the second source;
a first gate driver circuit connected to the first gate;
a second gate driver circuit connected to the second gate;
a control unit configured to control the first gate driver circuit and the second gate driver circuit;
a first decision unit configured to determine, based on a voltage at the first gate and a first threshold voltage, a state of the first gate in a first period in which a signal to turn OFF the first gate is output from the control unit to the first gate driver circuit; and
a second decision unit configured to determine, based on a voltage at the second gate and a second threshold voltage, a state of the second gate in a second period in which a signal to turn OFF the second gate is output from the control unit to the second gate driver circuit.

2. The switch system of claim 1, wherein
the bidirectional switch is a normally-off HET, of which the first gate includes a first p-type layer and a first gate electrode and of which the second gate includes a second p-type layer and a second gate electrode,
the first gate driver circuit includes:
a first gate resistor connected to the first gate;
a first switch connected to the first gate resistor in series and configured to be controlled by the control unit; and
a second gate resistor having a larger resistance value than the first gate resistor and connected in parallel with a series circuit of the first gate resistor and the first switch, and
the second gate driver circuit includes:
a third gate resistor connected to the second gate;
a second switch connected to the third gate resistor in series and configured to be controlled by the control unit; and
a fourth gate resistor having a larger resistance value than the third gate resistor and connected in parallel with a series circuit of the third gate resistor and the second switch.

3. The switch system of claim 2, wherein
the first decision unit
determines the first gate to be abnormal when finding the voltage at the first gate is lower than the first threshold voltage while a signal to turn ON the first gate and a signal to turn ON the first switch are output from the control unit, and
also determines the first gate to be abnormal when finding the voltage at the first gate is higher than the first threshold voltage while the signal to turn ON the first gate and a signal to turn OFF the first switch are output from the control unit, and
the second decision unit
determines the second gate to be abnormal when finding the voltage at the second gate is lower than the second threshold voltage while a signal to turn ON the second gate and a signal to turn ON the second switch are output from the control unit, and
also determines the second gate to be abnormal when finding the voltage at the second gate is higher than the second threshold voltage while the signal to turn ON the second gate and a signal to turn OFF the second switch are output from the control unit.

4. The switch system of claim 1, wherein the first period and the second period at least partially overlap with each other.

5. The switch system of claim 1, wherein the first period and the second period are defined at mutually different timings.

6. The switch system of claim 1, comprising:
a plurality of the bidirectional switches;
a plurality of the first decision units; and
a plurality of the second decision units, wherein
the plurality of the bidirectional switches are connected in parallel with each other,
the plurality of the first decision units and the plurality of the second decision units correspond one to one to the plurality of the bidirectional switches, and
the switch system is configured to regard at least one of the plurality of the bidirectional switches as a non-target bidirectional switch and make the first decision unit and the second decision unit respectively determine states of the first gate and the second gate of a target bidirectional switch out of the plurality of the bidirectional switches while a current is allowed to flow between the first source and the second source of the non-target bidirectional switch.

7. The switch system of claim 6, wherein
the switch system is configured to regard only one bidirectional switch as the target bidirectional switch out of the plurality of the bidirectional switches and regard all of the plurality of the bidirectional switches but the target bidirectional switch as the non-target bidirectional switches.

8. A switch system comprising:
a bidirectional switch including: a first source; a second source; a first gate provided closer to the first source between the first source and the second source and corresponding to the first source; and a second gate provided closer to the second source between the first source and the second source and corresponding to the second source;
a first gate driver circuit connected to the first gate;
a second gate driver circuit connected to the second gate;
a control unit configured to control the first gate driver circuit and the second gate driver circuit; and
a sensing unit connected to the bidirectional switch,
the switch system including multiple sets, each of which includes the bidirectional switch, the first gate driver circuit, the second gate driver circuit, the control unit, and the sensing unit,
a plurality of the bidirectional switches being connected in parallel with each other,
each of a plurality of the sensing units being configured to, when at least one of the plurality of the bidirectional switches, other than the bidirectional switch included in the same set as the sensing unit, is electrically conductive, sense the state of the bidirectional switch included in the same set as the sensing unit in each of
a first state where the control unit included in the same set as the sensing unit outputs a signal to turn OFF the first gate of the bidirectional switch included in the same set as the sensing unit and outputs a signal to turn ON the second gate thereof, and
a second state where the control unit included in the same set as the sensing unit outputs a signal to turn OFF the second gate of the bidirectional switch included in the same set as the sensing unit and outputs a signal to turn ON the first gate thereof.

9. The switch system of claim 8, wherein
each of a plurality of control units is configured to
have, in the first state, a state-sensing first OFF-state voltage applied to the first gate of the bidirectional switch included in the same set as the control unit, and
have, in the second state, a state-sensing second OFF-state voltage applied to the second gate of the bidirectional switch included in the same set as the control unit.

10. The switch system of claim 9, wherein
each of the plurality of the sensing units includes a decision unit configured to determine, based on a current flowing between the first source and the second source of the bidirectional switch included in the same set as the sensing unit and a predetermined value, the state of the bidirectional switch included in the same set as the sensing unit.

11. The switch system of claim 9, wherein
each of the plurality of the sensing units includes a decision unit,
each of a plurality of the decision units is configured to,
in a state where the control unit included in the same set as the decision unit outputs a signal to turn ON the first gate of the bidirectional switch included in the same set as the decision unit and a signal to turn ON the second gate thereof,
determine, based on a current flowing between the first source and the second source of the bidirectional switch included in the same set as the decision unit and a first predetermined value, whether or not the bidirectional switch included in the same set as the decision unit is operating properly, and
in each of a state where the control unit included in the same set as the decision unit outputs a signal to turn OFF the first gate of the bidirectional switch included in the same set as the decision unit and a signal to turn ON the second gate thereof and a state where the control unit included in the same set as the decision unit outputs a signal to turn OFF the second gate of the bidirectional switch included in the same set as the decision unit and a signal to turn ON the first gate thereof,
determine, based on the current flowing between the first source and the second source of the bidirectional switch included in the same set as the decision unit and a second predetermined value, whether or not the bidirectional switch included in the same set as the decision unit is operating properly.

12. The switch system of claim 10, wherein
each of the plurality of the sensing units includes a resistor connected in series with the bidirectional switch included in the same set as the sensing unit.

13. The switch system of claim 12, wherein
each of the plurality of the sensing units includes:
a converter circuit configured to convert a voltage across a resistor included in the sensing unit into an absolute value; and
a comparator circuit configured to compare the absolute value with a predetermined threshold voltage.

14. The switch system of claim 12, wherein
each of a plurality of the resistors has:
a first terminal connected to the bidirectional switch included in the same set as the resistor; and
a second terminal provided opposite from the first terminal, and
each of the plurality of the decision units includes:
a first comparator circuit configured to compare, by reference to a potential at the second terminal of the resistor, a potential at the first terminal with the potential at the second terminal; and
a second comparator circuit configured to compare, by reference to the potential at the first terminal of the resistor, the potential at the second terminal with the potential at the first terminal.

15. The switch system of claim 12, wherein
the resistor of each of the plurality of the sensing units includes:
a first resistor connected to the first source of the bidirectional switch included in the same set as the sensing unit; and
a second resistor connected to the second source of the bidirectional switch included in the same set as the sensing unit, and
each of the plurality of the sensing units includes:
a first decision circuit configured to determine the bidirectional switch to be operating improperly when finding a voltage across the first resistor higher than a first reference voltage while the control unit included in the same set as the sensing unit is in the first state; and
a second decision circuit configured to determine the bidirectional switch to be operating improperly when finding a voltage across the second resistor higher than a second reference voltage while the control unit included in the same set as the sensing unit is in the second state.

16. The switch system of claim 9, wherein
each of the plurality of the sensing units includes
a temperature detection unit configured to detect a temperature of the bidirectional switch included in the same set as the sensing unit, and
the sensing unit is configured to
determine, when finding the temperature detected by the temperature detection unit is higher than a threshold temperature while the control unit included in the same set as the sensing unit is in the first state, the bidirectional switch included in the same set as the sensing unit to be operating improperly, and
determine, when finding the temperature detected by the temperature detection unit is higher than the threshold temperature while the control unit included in the same set as the sensing unit is in the second state, the bidirectional switch included in the same set as the sensing unit to be operating improperly.

17. The switch system of claim 9, wherein
each of the plurality of the bidirectional switches is a normally-off NET, of which the first gate includes a first p-type layer and a first gate electrode and of which the second gate includes a second p-type layer and a second gate electrode, and
each of the plurality of the sensing units includes:
a first sensing unit configured to, in a state where control unit included in the same set as the sensing unit outputs a signal to turn OFF the second gate of the bidirectional switch included in the same set as the first sensing unit and outputs a signal to turn ON the first gate thereof, sense, based on a voltage at the first gate, a power distribution state between the first source and the second source of the bidirectional switch included in the same set as the first sensing unit; and
a second sensing unit configured to, in a state where control unit included in the same set as the sensing unit outputs a signal to turn OFF the first gate of the bidirectional switch included in the same set as the second sensing unit and outputs a signal to turn ON the second gate thereof, sense, based on a voltage at the second gate, the power distribution state between the first source and the second source of the bidirectional switch included in the same set as the second sensing unit.

18. The switch system of claim 17, wherein
each of a plurality of the first gate driver circuits includes
a first gate resistor connected to the first gate of the bidirectional switch included in the same set as the first gate driver circuit,
each of a plurality of the second gate driver circuits includes
a second gate resistor connected to the second gate of the bidirectional switch included in the same set as the second gate driver circuit,
each of a plurality of the first sensing units is configured to determine, when finding a voltage across the first gate resistor connected to the bidirectional switch included in the same set as the first sensing unit is higher than a first predetermined voltage, the bidirectional switch included in the same set as the first sensing unit to be operating improperly, and
each of a plurality of the second sensing units is configured to
determine, when finding a voltage across the second gate resistor connected to the bidirectional switch included in the same set as the second sensing unit is higher than a second predetermined voltage, the bidirectional switch included in the same set as the second sensing unit to be operating improperly.

19. The switch system of claim 8, wherein
each of a plurality of the control units is configured to set, at mutually different timings,
a period in which the first gate driver circuit included in the same set as the control unit outputs a signal to turn OFF the first gate of the bidirectional switch included in the same set as the control unit, and
a period in which the second gate driver circuit included in the same set as the control unit outputs a signal to turn OFF the second gate of the bidirectional switch included in the same set as the control unit.

20. The switch system of claim 8, further comprising a controller configured to control a plurality of the control units,
the controller being configured to control the plurality of the control units such that each of the plurality of the sensing units senses the state of the bidirectional switch included in the same set as the sensing unit, the plurality of the sensing units sensing respective states of the bidirectional switches at mutually different timings.

\* \* \* \* \*